(12) United States Patent
Kimura

(10) Patent No.: US 7,688,143 B2
(45) Date of Patent: Mar. 30, 2010

(54) VARIABLE GAIN CIRCUIT

(75) Inventor: Katsuji Kimura, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 14 days.

(21) Appl. No.: 12/081,092

(22) Filed: Apr. 10, 2008

(65) Prior Publication Data

US 2008/0278238 A1 Nov. 13, 2008

(30) Foreign Application Priority Data

Apr. 16, 2007 (JP) ............................. 2007-107213

(51) Int. Cl.
*H03F 3/45* (2006.01)

(52) U.S. Cl. ....................................... 330/254; 330/253

(58) Field of Classification Search .................. 330/253, 330/254, 278
See application file for complete search history.

(56) References Cited

U.S. PATENT DOCUMENTS 6,867,650 B2 3/2005 Kimura ....................... 330/254

2008/0018401 A1* 1/2008 Quoc et al. .................. 330/254

FOREIGN PATENT DOCUMENTS

JP 2003-179447 6/2003

OTHER PUBLICATIONS

Duong, et al., "A 95-dB Linear Low-Power Variable Gain Amplifier", IEEE Trans. Circuit & Systems-I, vol. 53, No. 8, pp. 1648-1657, Aug. 2006.

* cited by examiner

*Primary Examiner*—Khanh V Nguyen
(74) *Attorney, Agent, or Firm*—McGinn IP Law Group, PLLC

(57) ABSTRACT

Disclosed is a variable gain circuit including a gain change region in which the gain is changed substantially exponentially as a function of a control voltage. The gain is changed in the gain change region substantially exponentially based on a function $\{(1+x)^2+K\}/\{(1-x)^2+K\}$, where x is a control voltage and K is a parameter of $K \leq 1$. The parameter K of the function is about equal to 0.21. The denominator and the numerator of the function are proportionate to driving currents of OTAs (operational transconductance amplifiers). Or, the denominator and the numerator of the above function are constituted by output currents of a MOS differential pair and a quadritail cell that includes four transistors driven by a common tail current. Outputs of two of the transistors, receiving a differential input voltage, are connected in common and outputs of the other two of the transistors, receiving the common mode voltage of the differential input voltage, are connected in common.

20 Claims, 18 Drawing Sheets

REFERENCE CASE

VARIABLE GAIN CIRCUIT

REFERENCE TO RELATED APPLICATION

The present application is claiming the priority of the earlier Japanese patent application No. 2007-107213 filed on Apr. 16, 2007, the entire disclosure thereof being incorporated herein by reference thereto.

FIELD OF THE INVENTION

This invention relates to a variable gain amplifier circuit (VGA circuit). More particularly, it relates to a variable gain amplifier circuit which has a gain changed exponentially as a function of a control signal, operates from a low voltage, has a broad operating range and a broad dynamic range, and which may be formed with advantage on a semiconductor integrated circuit.

BACKGROUND OF THE INVENTION

This sort of the variable gain amplifier circuits were hitherto implemented mostly in accordance with an approximation termed bilinear transform, represented by the following approximation (1):

$$e^{2x} \approx \frac{1+x}{1-x} = 1 + 2x + 2x^2 + 2x^3 + \dots \quad (-1 < x < 1) \tag{1}$$

In the bilinear transform, represented by the approximation (1), it is not $e^x$ but $e^{2x}$ that is approximated.

On the other hand, an exponential function is given by $$e^x = 1 + x + \frac{x^2}{2} + \frac{x^3}{6} + \dots + \frac{x^n}{n!} + \dots \tag{2}$$

and is represented by an identity making use of a hyperbolic function (tan h(x)):

$$e^x = \frac{1+\tanh\left(\frac{x}{2}\right)}{1-\tanh\left(\frac{x}{2}\right)} \tag{3}$$

This identity appears in a set of formulas and may be derived with ease from the following definition of the hyperbolic function (tan h(x)):

$$\tanh(x) = \frac{e^x - e^{-x}}{e^x + e^{-x}} \tag{4}$$

That is, $e^{2x}$ may be found as $$e^{2x} = \frac{1+\tanh(x)}{1-\tanh(x)}. \tag{5}$$

There is not disclosed the equation (3) or (5) in past papers or Patent Documents that treat the variable gain circuits having the gain changed exponentially, with the exception of Patent Document 1 (JP Patent Kokai Publication No. JP-P2003-179447A) by the same inventor as the present inventor.

Comparing the equation (2) with the equation (1), we might readily imagine that an approximation error amounts to a rather large value.

For example, approximation of $$\tanh(x) \approx x + \frac{x^3}{3} \quad (|x| \ll 1) \tag{6}$$

in the equation (5) leads to the following expression for $e^{2x}$:

$$e^{2x} = \frac{1+\tanh(x)}{1-\tanh(x)} \approx \frac{1+x+\frac{x^3}{3}}{1-x-\frac{x^3}{3}} \tag{7}$$

The relationship between the original function $e^{2x}$ and its approximations (1) and (7) is shown in FIG. 1, in which the vertical axis and the horizontal axis stand for the gain (dB) and x, respectively. In FIG. 1, a characteristic (b) is for exp (2x), which is linear because it is shown in log scale. On the other hand, a curve or characteristic (a), connecting triangular-shaped dots, is for the approximation (1), and a curve or characteristic (c), connecting lozenge-shaped dots, is for the equation (7).

It will be seen from FIG. 1 that the approximation error of the bilinear transform, represented by the approximation (1), is of a noticeably large value.

It is noted that the bilinear transform, represented by the approximation (1), is to be used as an approximation for the exponential function $e^{2x}$ within a range of x on the order of −0.5<x<0.5.

Thus, if a circuit is to be implemented based on the approximation of the equation (1), termed the bilinear transform, the approximation error is increased. This approximation error cannot be decreased except by reducing the range of the input voltage.

[Patent Document 1] JP Patent Kokai Publication No. JP-P2003-179447A

[Non-Patent Document 1] Q.-H. Duong Q. Le, C.-W. Kim, and S.-G. Lee, "A 95-dB Linear Low-Power Variable Gain Amplifier", IEEE Trans. Circuit & Systems-I, Vol. 53, No. 8, pp. 1648-1657, August 2006

SUMMARY OF THE DISCLOSURE

The following analysis is given by the present invention. The entire disclosures of the above mentioned Patent Document and Non-Patent Document are herein incorporated by reference thereto. The variable gain circuit, which has implemented the aforementioned conventional bilinear transform, suffers the following deficiencies, and hence is not optimum.

The first deficiency is that, with the bilinear transform, no sufficient dynamic range may be secured because of the significant approximation error with the bilinear transform.

The second deficiency is that the width of variations of the control voltage is necessarily set to a narrower value. The reason is that the approximation error is significant with the bilinear transform and hence the operating range needs to be set to a narrower value.

It is an object of the present invention to provide a variable gain circuit of a broad dynamic range with a smaller circuit size. It is another object of the present invention to provide a variable gain circuit in which the approximation error may be set to a smaller value with a smaller circuit size.

The invention disclosed in the present application may be summarized substantially as follows:

A variable gain circuit according to the present invention has a region in which a gain is changed substantially exponentially as a function of a control voltage, wherein said circuit has a region in which the gain is changed substantially exponentially based on a function $$\{(1+x)^2+K\}/\{(1-x)^2+K\}$$

where x is a variable indicating the control voltage, and K is a parameter less than or equal to 1.

With the variable gain circuit, according to the present invention, the parameter K in the function is about 0.21.

According to the present invention, the denominator and the numerator of the above function are proportionate to the driving currents of OTAs (operational transconductance amplifiers).

According to the present invention, the denominator and the numerator of the above function are constituted by output currents of a MOS differential pair and a quadritail cell. The quadritail cell includes four transistors driven by a common tail current, outputs of two of the transistors, receiving a differential input voltage, are connected in common, and outputs of the other two of the transistors, receiving the common mode voltage of the differential input voltage, are also connected in common.

According to the present invention, the denominator and the numerator of the above function are constituted by subtracting a constant current from output currents of MOS current squaring circuits. The MOS current squaring circuit includes two sets of cascoded transistors, in which gates of upper and lower stages of the transistors are connected in common, one of the two lower stage transistors has a drain and a gate connected in common to form a current input terminal and output currents of the two sets of the cascoded transistors are summed to generate the squared current.

The meritorious effects of the present invention are summarized as follows.

The first meritorious effect is that a wide dynamic range may be realized by newly setting a function approximating an exponential function.

The second meritorious effect is that the approximation error may be set to a smaller value, despite a smaller circuit size, by arraying the approximation error on both the plus and minus sides (±sides).

Still other features and advantages of the present invention will become readily apparent to those skilled in this art from the following detailed description in conjunction with the accompanying drawings wherein examples of the invention are shown and described, simply by way of illustration of the mode contemplated of carrying out this invention. As will be realized, the invention is capable of other and different examples, and its several details are capable of modifications in various obvious respects, all without departing from the invention. Accordingly, the drawing and description are to be regarded as illustrative in nature, and not as restrictive.

BRIEF DESCRIPTIONS OF THE DRAWINGS

PREFERRED MODES OF THE INVENTION

Figure 1:
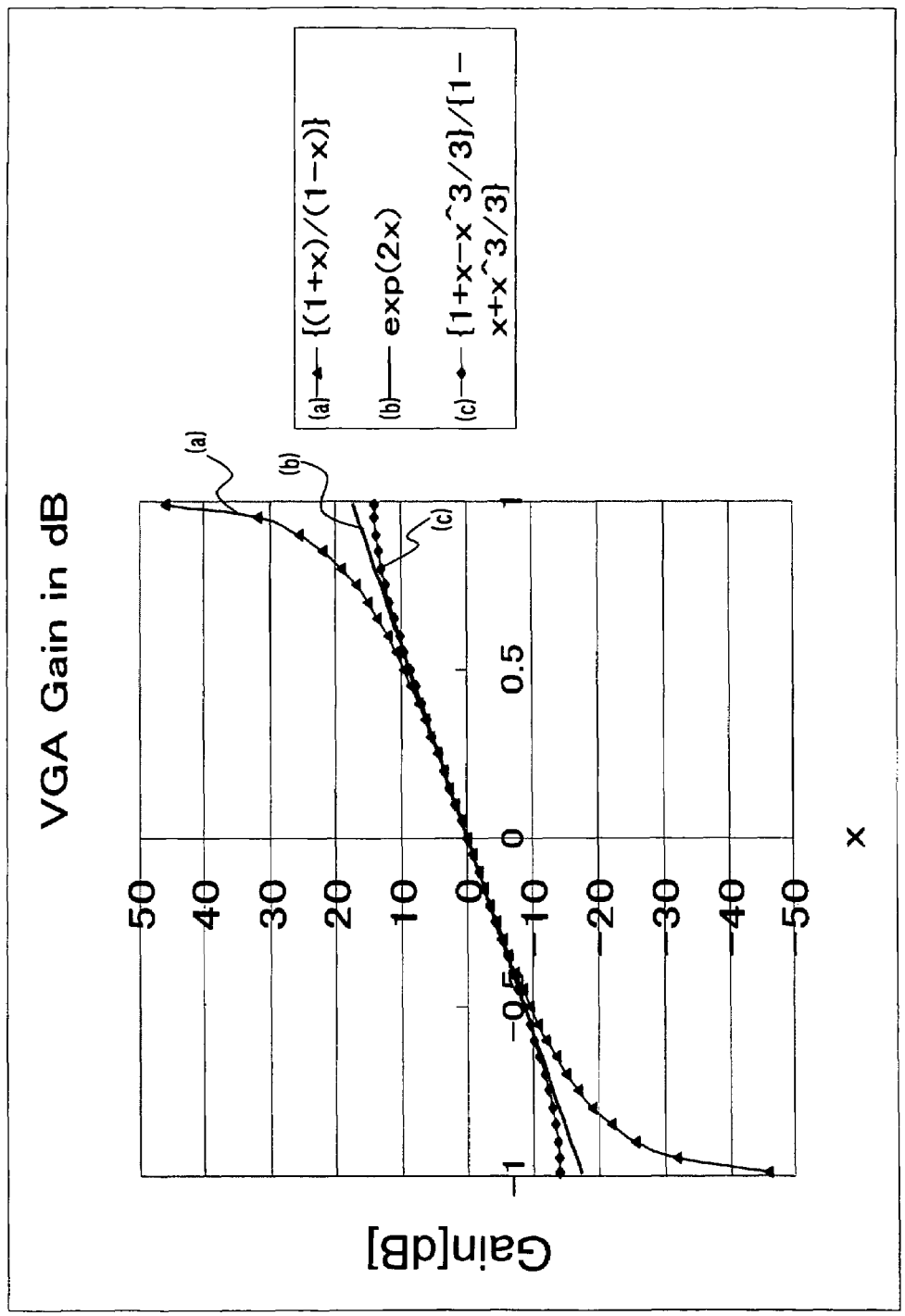
FIG. 1 is a graph showing characteristics of a conventional bilinear transform and approximations.

An example of the present invention is now described. From an exponential function, shown in the equation (2), $e^{-x}$ is represented as $$e^{-x} = 1 - x + \frac{x^2}{2} - \frac{x^3}{6} + \ldots + (-1)^n \frac{x^n}{n!} + \ldots \quad (8)$$

Then, using $e^x$ and $e^{-x}$, $e^{2x}$ may be represented as follows:

$$e^{2x} = \frac{e^x}{e^{-x}} = \frac{1 + x + \frac{x^2}{2} + \frac{x^3}{6} + \ldots + \frac{x^n}{n!} + \ldots}{1 - x + \frac{x^2}{2} - \frac{x^3}{6} + \ldots + (-1)^n \frac{x^n}{n!} + \ldots}. \quad (9)$$

If, in the above equation, approximation to the term $x^3$ is taken for both $e^x$ and $e^{-x}$, $e^{2x}$ may be represented by $$e^{2x} = \frac{e^x}{e^{-x}} \approx \frac{1+x+\frac{x^2}{2}+\frac{x^3}{6}}{1-x+\frac{x^2}{2}-\frac{x^3}{6}} \quad (10)$$

so that the approximation error may be expected to be smaller than with the approximation (7).

If approximation to the term of $x^2$ is used for both $e^x$ and $e^{-x}$, $e^{2x}$ may be represented by the following approximation $$e^{2x} = \frac{e^x}{e^{-x}} \approx \frac{1+x+\frac{x^2}{2}}{1-x+\frac{x^2}{2}} = \frac{(1+x)^2+1}{(1-x)^2+1} \quad (11)$$

Figure 2:
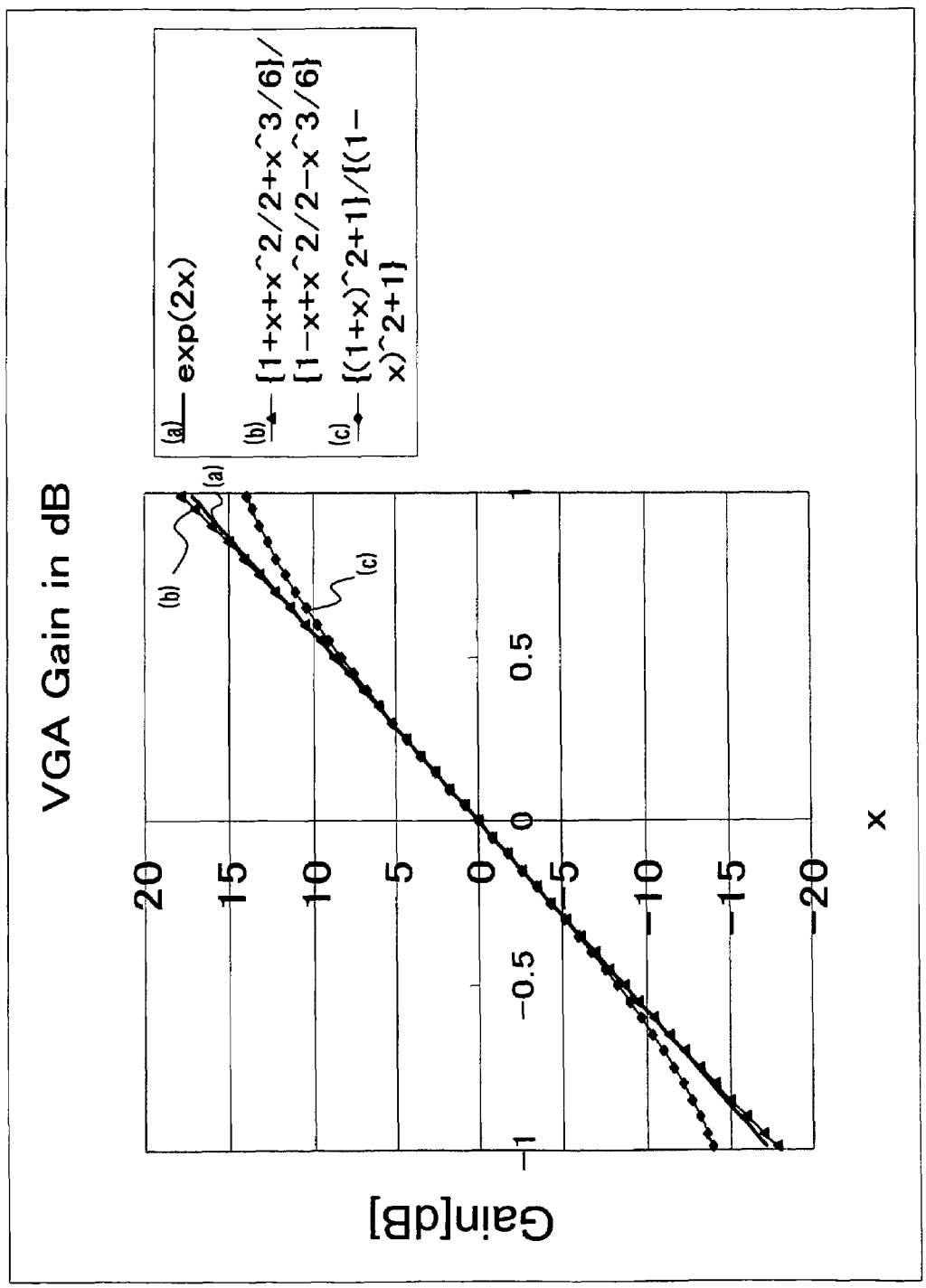
FIG. 2 is a graph showing characteristics of exponential functions taken up to a second order term of x and up to a third order term of x.

FIG. 2 shows approximations (10) and (11) in a graphic form. In FIG. 2, (a) stands for exp(2x), a curve or characteristic (b) connecting triangular-shaped dots stands for (10) and a curve or characteristic (c) connecting lozenge-shaped dots stands for (11). An approximation error of the approximation (11) is greater than that of the approximation (10), as may be anticipated, even though the approximation error of the approximation (11) is lesser than that of the bilinear transform (1).

It may be surmised that, in the approximation (11), the constant +1 may be effective. The reason is that, if this constant +1 is removed and set to 0, the approximation (11) is simply a squared form of the bilinear transform (1), with the gradient only being doubled in FIG. 1.

If, in order to implement a variable gain circuit having a log-linear characteristic, exhibiting high linearity, that is, an exponential characteristic, the approximation is found as described above and the characteristic shown by the approximation is to be implemented in a circuit, it goes without saying that a smaller value of the approximation error of the approximation used is a prerequisite.

It also goes without saying that, if the approximation error is to be reduced, it is sufficient to leave higher order terms up to a proper order of a variable x of the denominator as well as the same variable x of the numerator of the equation (9).

It is however of a problem how easy it might be to implement the circuit with these higher order terms.

As a matter of course, the lower the order of x, the smaller may be the size of the variable gain circuit.

In particular, if the terms up to the second order term of x are left, a squaring circuit may be used. If the terms up to the third power of x are left, a tripling circuit would be needed. However, in this case, the circuit necessarily becomes complex, thus possibly increasing the circuit size.

After all, such a circuit that implements an approximation (11) including the terms of x up to the second order term would be easy to implement.

Although the approximations (1) and (7) are monotonous functions, it is unnecessary that the function is monotonous, provided that the approximation error is small.

It is among the techniques of rounding the approximation error to distribute the approximation error on both the plus and the minus sides, instead of biasing the approximation error on only the plus side or the minus side.

It is now considered whether or not the approximation error can be reduced when the constant 1 in the equation (11) is replaced by a parameter K, where K<1. That is, a function corresponding to the equation (11) where the parameter K is substituted for the constant 1 such that $$f(x)=\{(1+x)^2+K\}/\{(1-x)^2+K\} \quad (12)$$

is newly introduced as an approximation.

Figure 3:
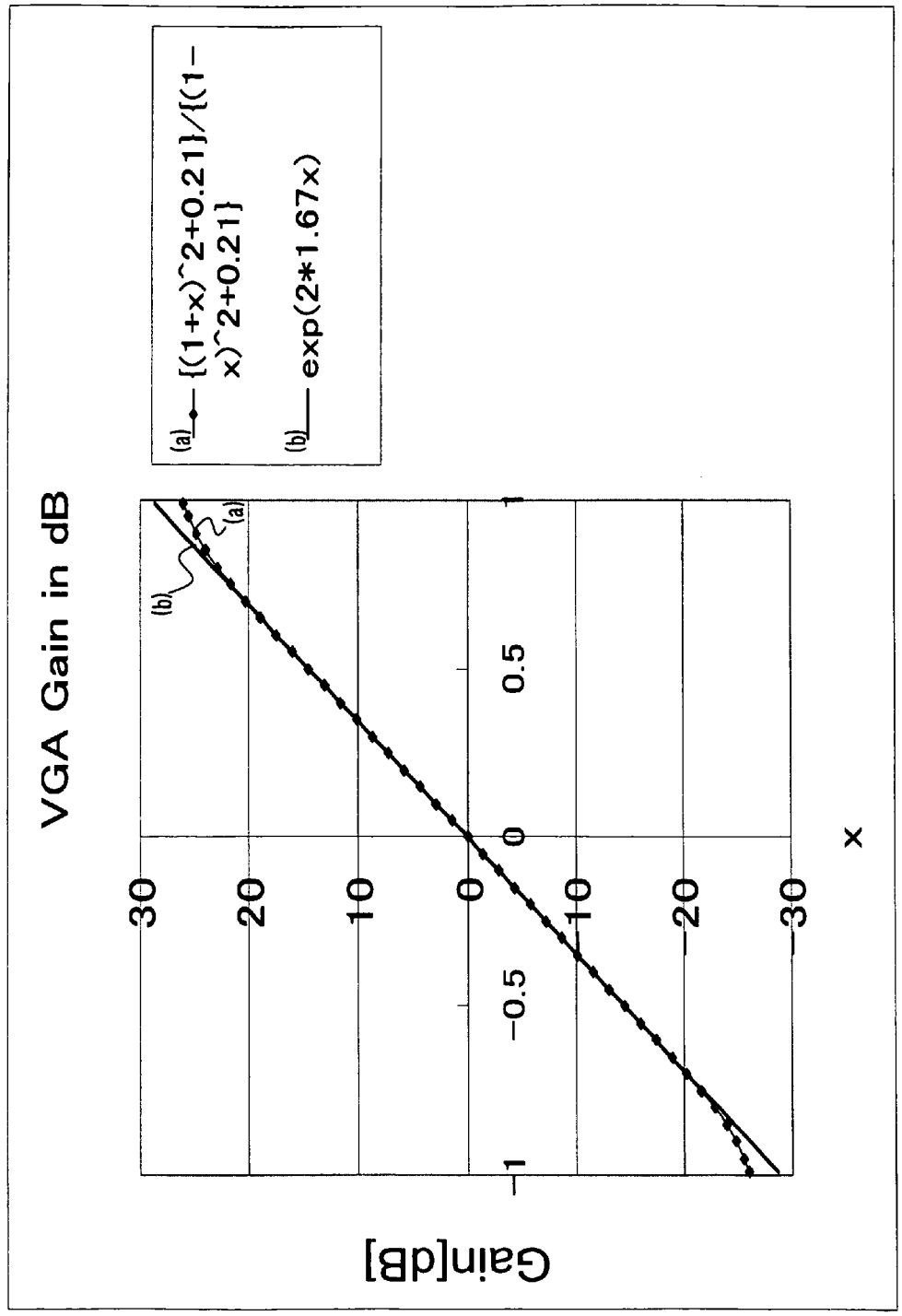
FIG. 3 is a graph showing a characteristic of an approximation adopted by the present invention.

FIG. 3 shows a characteristic of the newly introduced approximation. In this figure, a curve or characteristic (a), obtained on connecting lozenge-shaped dots, stands for the equation (12) in which K=0.21 and a=1.67 ($\approx$⁵⁄₃), and a characteristic (b) stands for exp(2ax). Although the gradient is not an integer, the curve approximates an exponential function $e^{2ax}$.

The source of this approximation might be in about a dozen of papers by S.-G. Lee, an assistant professor of the University of Information and Communications of Korea, leading a group of his associate researchers. However, the explanation in these papers as to how the approximation has been introduced is not appropriate in terms of logic and may not be readily understood. At least, only one parameter K should be sufficient for purposes of optimization. However, 'a' is also used here as a parameter besides K to complicate the variables to render it more difficult to understand the approximation. Also, the width of change of the variable ax should be within a range such that $-1<ax<1$.

Referring to FIG. 3, for the range of x of $-0.7\leq x\leq 0.7$, the approximation error is less than ±0.08 dB, such that a width of gain of 40.6 dB (±20.3 dB) may be maintained. The present invention is now described with reference to examples.

Example 1

The method for implementing a practical circuit approximating an exponential characteristic, using the equation (12), is now described.

Figure 4:
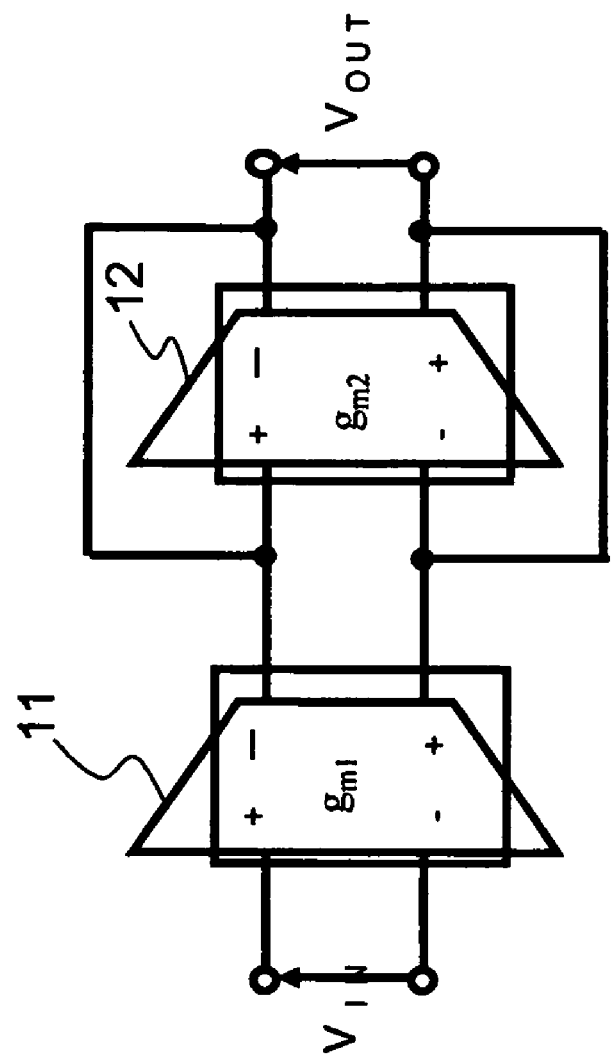
FIG. 4 is a diagram showing the configuration of a variable gain circuit adopted by the present invention.

One of the methods for constructing the variable gain circuit, based on the equation (12), is to use two OTAs 11 and 12 shown in FIG. 4. The first OTA 11 converts an input voltage (differential input voltage) $V_{IN}$ into a current to deliver a differential output. The second OTA 12 has input and output terminals connected together. More specifically, a non-inverting input terminal of the second OTA 12 is connected to its inverting output terminal, and its inverting input terminal is connected to its non-inverting output terminal. The second OTA 12 receives the differential current from the first OTA 11 and delivers an output voltage VOUT (differential output voltage) by way of performing the current-to-voltage conversion.

That is, there is such an OTA (Operational Conductance Amplifier) circuit in which a value of G, a voltage gain of a variable gain circuit such that $G=V_{OUT}/V_{IN}$, is expressed by $$G=g_{m1}/g_{m2} \quad (13)$$

where $g_{m1}$ and $g_{m2}$ are values of mutual conductance of the OTA 11 and the OTA 12, respectively.

It should be noticed however that, in a bipolar circuit, the driving current for an OTA, proportionate to a tail current $I_0$ that drives a differential pair, is proportionate to gm, whereas, in a MOS circuit, the square root ($\sqrt{}$) of the driving current for the OTA is proportionate to gm. Thus, with the MOS circuit, the gradient shown in FIG. 3 is halved, thus achieving the width of variation of the order of ±10 dB. Nevertheless, the driving current ratio for the OTA is on the order of 1:100, so that, for assuring the operating input voltage range, the minimum driving current must be of a reasonably high value. It is thus difficult to achieve the low current.

Figure 5B:
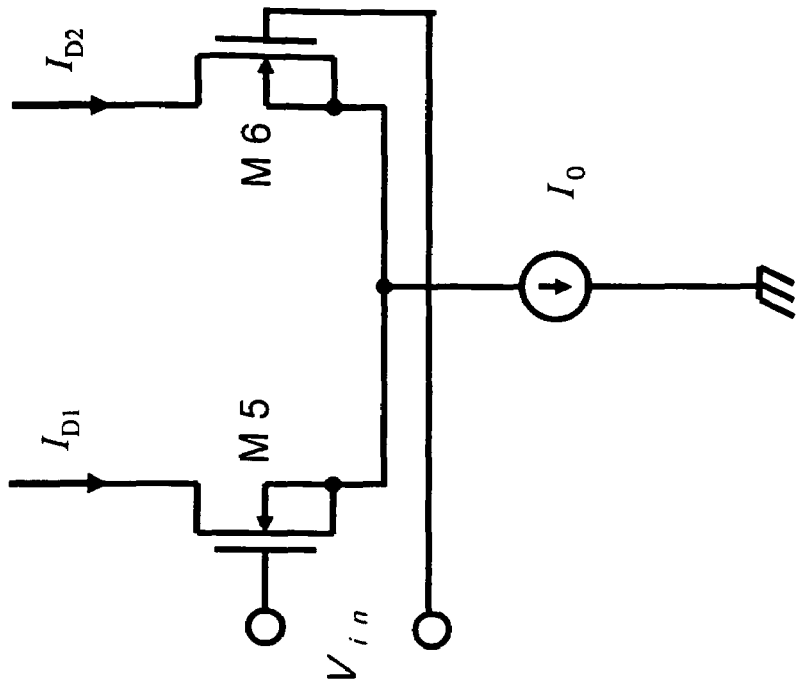
FIGS. 5A and 5B are diagrams showing a quadritail cell and a MOS differential pair used in a first example of the present invention, respectively.
Figure 5A:
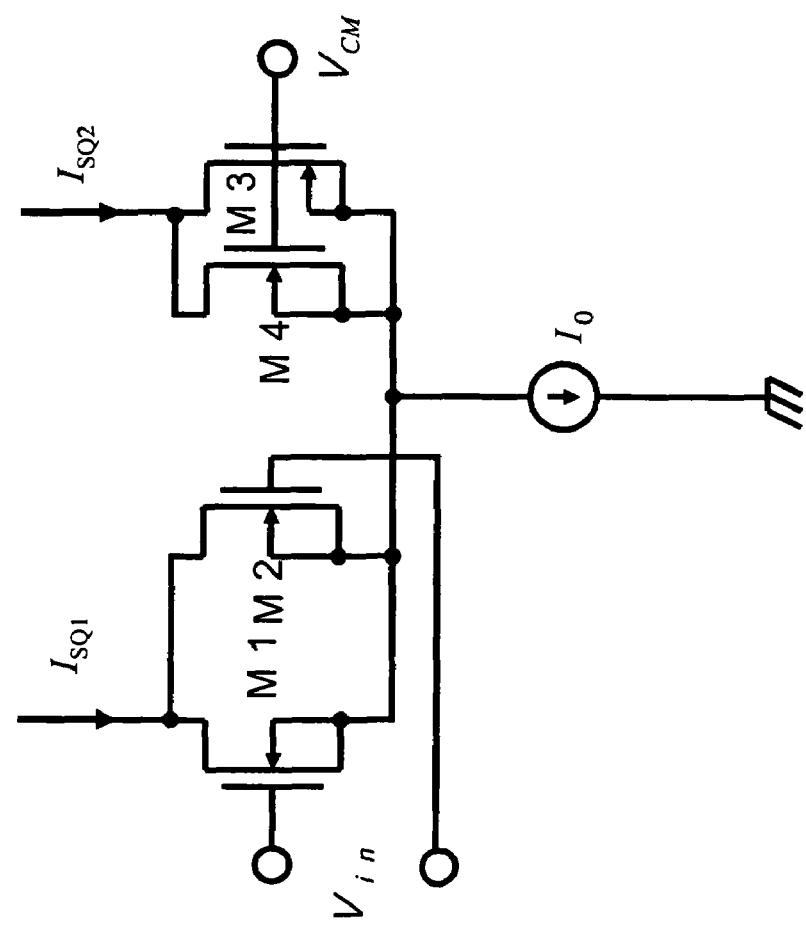

The control circuit is constructed using a quadritail cell, shown in FIG. 5A, as a squaring circuit.

In the equation (10), $(1\pm x)^2 = 1\pm 2x + x^2$. The term $x^2$ is implemented by the quadritail cell, and the term $\pm 2x$ is implemented by doubling the driving current of the MOS differential circuit shown in FIG. 5B.

The term of the constant (1+x) is implemented by a constant current source.

Referring to FIG. 5A, the quadritail cell includes n-ch MOS transistors M1 and M2, having the gates supplied with the differential input voltage $V_{in}$ and having drains connected in common, and n-ch MOS transistors M3 and M4, having gates supplied with an common mode voltage $V_{CM}$ and having drains connected in common. The transistors M1 to M4 have sources coupled in common and connected to a constant current source of a current value equal to $I_0$. Referring to FIG. 5B, the MOS differential circuit includes MOS transistors M5 and M6, having gates supplied with the differential input voltage $V_{in}$ and having sources connected in common and connected to the constant current source $I_0$. $I_{SQ1}$ is a current flowing through the common drain of the transistors M1 and M2, and $I_{SQ2}$ is a current flowing through the common drain of the transistors M3 and M4. $I_{D1}$ and $I_{D2}$ are currents flowing through the drains of the transistors M5 and M6, respectively.

It is assumed that the sizes of the two transistors M5 and M6 of the MOS differential circuit are a unit transistor size, and that the tail currents ($I_0$) of the respective transistors are the same.

In case the sizes of the four transistors M1 to M4 of the quadritail cell of FIG. 5A are set to four times the size of the two transistors of the MOS differential circuit of FIG. 5B, the operating input voltage ranges of the quadritail cell and the MOS differential circuit are coincident with each other. The transfer function of the quadritail cell and the transfer function of the MOS differential circuit may then be represented by the following equations (15a, 15b) and (16), respectively:

$$\frac{I_{SQ1}}{I_0} = \frac{1}{2} + x^2 \quad \left(|x| \leq \frac{1}{\sqrt{6}}\right) \tag{15a}$$

$$\frac{I_{SQ1}}{I_0} = \frac{1}{3} + \frac{2x^2 + 4|x|\sqrt{3-2x^2}}{9} \quad \left(\frac{1}{\sqrt{6}} \leq |x| \leq 1\right) \tag{15b}$$

$$\frac{I_{D1,2}}{I_0} = \frac{1}{2} \pm \frac{x}{\sqrt{2}}\sqrt{1-\frac{x^2}{2}} \quad (|x| \leq 1) \tag{16}$$

The variable x is a standardized control voltage and may be expressed by $$x = \frac{V_C}{\sqrt{\frac{I_0}{\beta}}}. \tag{17}$$

In the above equation, $V_C$ is a control voltage and $\beta$ is a transconductance parameter of the unit transistor represented by $$\beta = \mu\left(\frac{W}{L}\right) \tag{18}$$

where $\mu$ denotes electron mobility and W and L denote the gate width and the gate length of the unit transistor, respectively.

Figure 6:
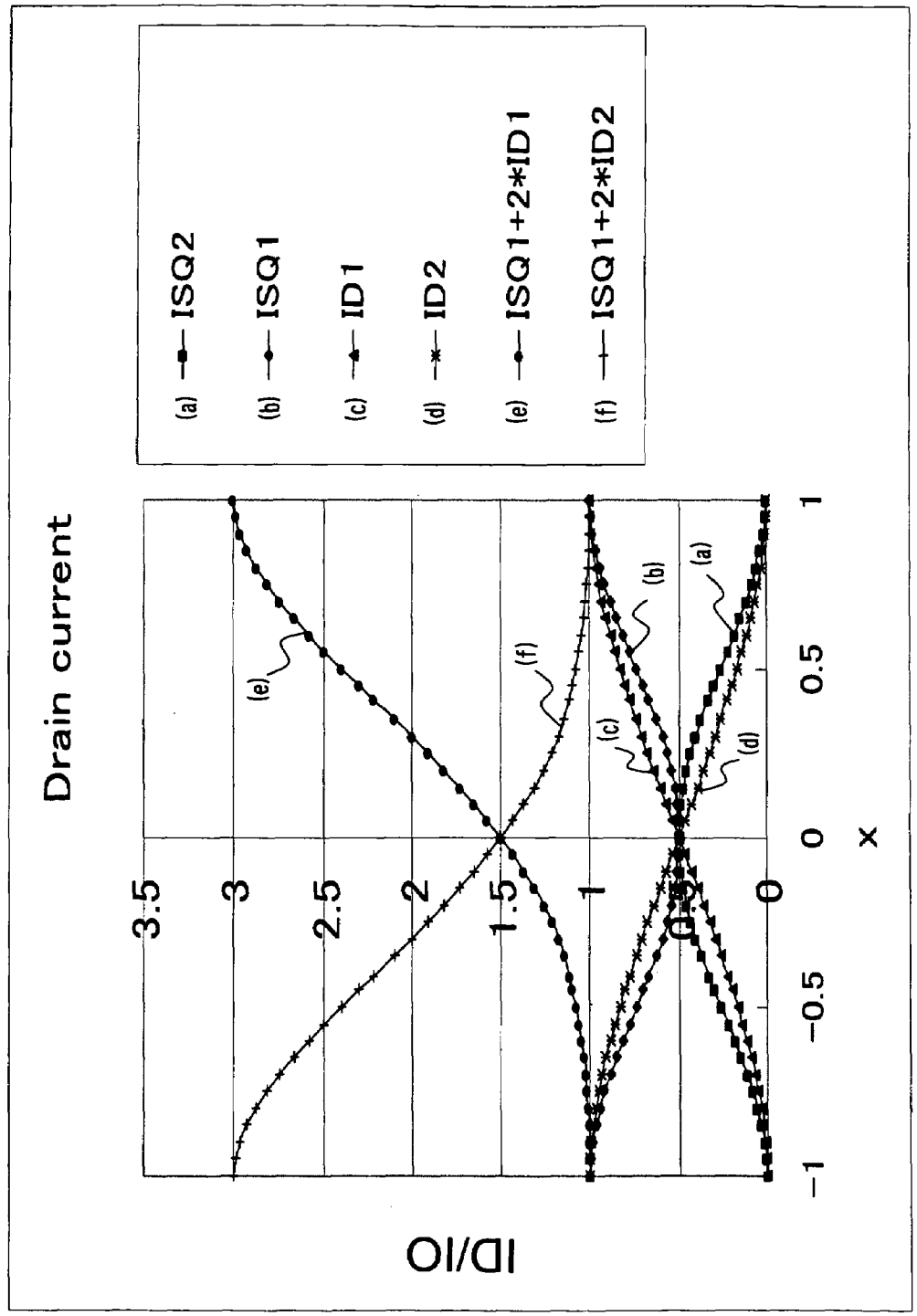
FIG. 6 is a graph showing control current characteristics obtained from the quadritail cell and the MOS differential pair used in the first example of the present invention.

The characteristics (e) and (f) of FIG. 6 may thus be found by doubling the $I_{D1}$ ($I_{D2}$) of the equation (16) and adding the result to the current $I_{SQ1}$ of the equation (15). Meanwhile, the current characteristics (a), (b), (c) and (d) are those for $I_{SQ2}$, $I_{SQ1}$, $I_{D1}$ and $I_{D2}$, respectively.

Figure 7:
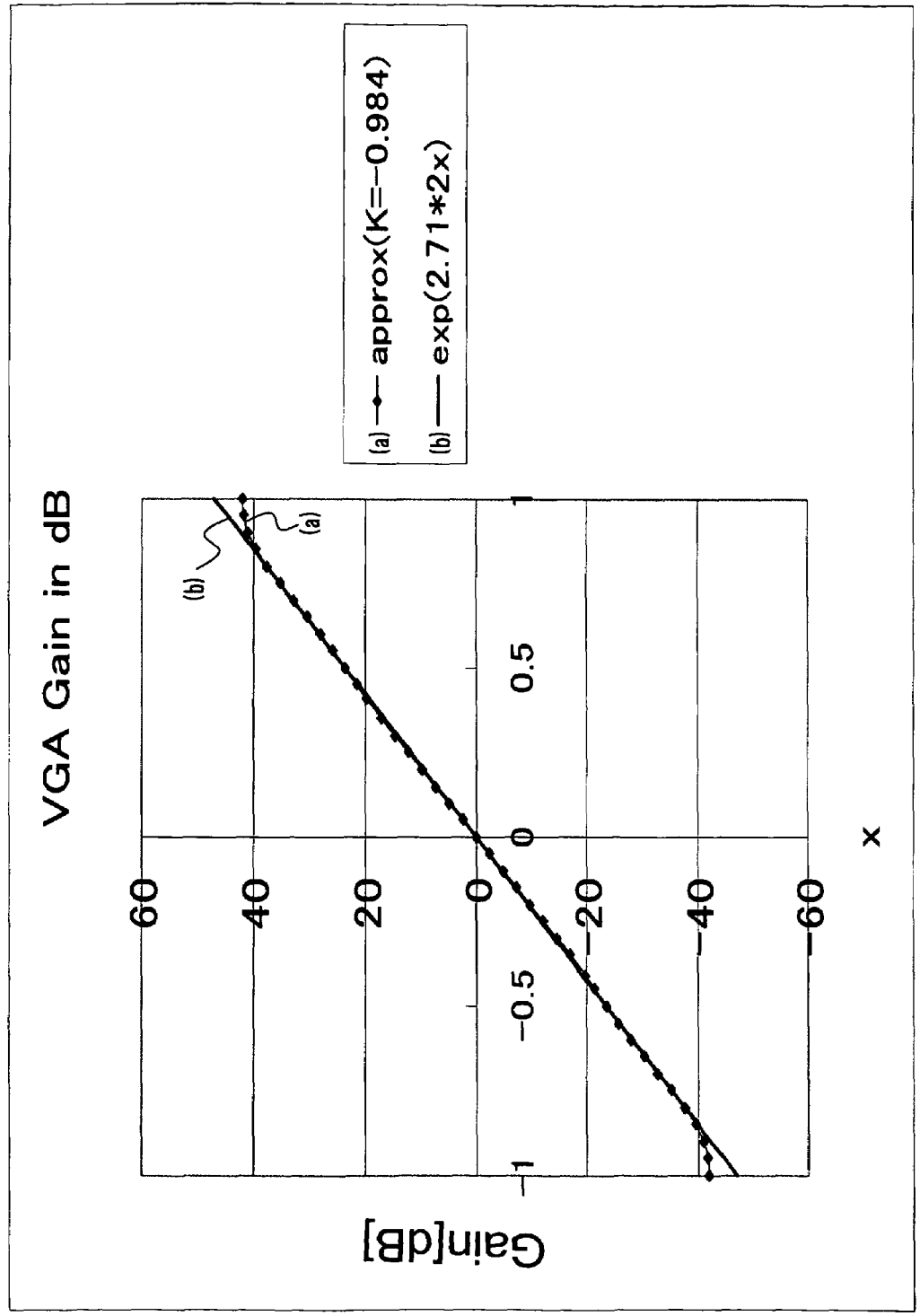
FIG. 7 is a graph showing gain characteristics obtained from the quadritail cell and the MOS differential pair used in the first example of the present invention.

If, using a constant current source, K is set so that K=−0.984, the characteristic (VGA gain characteristic) of $$G = (I_{SQ1}/I_0 + 2I_{D1}/I_0 + K)/(I_{SQ1}/I_0 + 2I_{D2}/I_0 + K) \tag{19}$$

is as shown in FIG. 7. In this figure, the characteristic (a) connecting the lozenge-shaped dots is for the equation (19). The characteristic (b) is for exp(2.7*2x).

Referring to FIG. 7, the approximation error is within a range of ±0.5 dB for a width of change of ±40 dB.

If the current shown in FIG. 4 is implemented using a MOS circuit, it may be expected that, for a width of change of ±020 dB, the approximation error is within a range of ±0.25 dB.

It should be noted that, from the condition for the tail current in a quadritail cell, $$I_{SQ1} + I_{SQ2} = I_0 \tag{20}$$

and hence $I_{SQ1}$ may be obtained by subtracting $I_{SQ2}$ from $I_0$.

Figure 8:
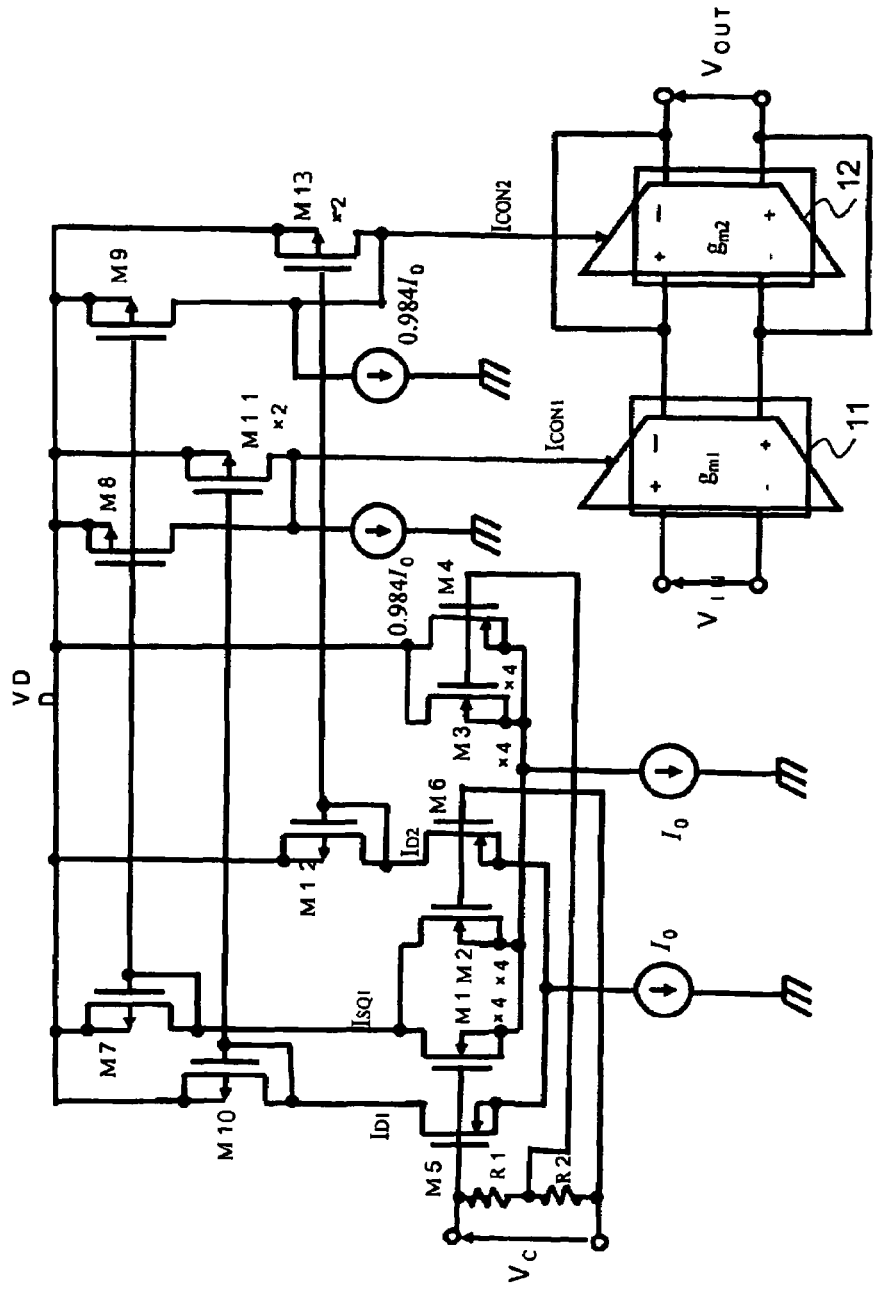
FIG. 8 is a diagram showing a circuit configuration of the first example of the present invention.

FIG. 8 illustrates an implementing circuit.

In FIG. 8, the control signal $V_C$ is supplied across the gate terminals of the transistors M1 and M2 that form the quadritail cell. The control signal is simultaneously supplied across the gate terminals of the transistors M5 and M6 that make up the MOS differential pair. To obtain the common mode voltage of the control signal $V_C$, resistors R1 and R2 (=R1) are inserted across an input pair to halve $V_C$ and the resulting common mode voltage is applied to a common gate terminal of the transistors M3 and M4 that form the quadritail cell.

In FIG. 8, the MOS differential pair (M5, M6) and the quadritail cell (M1 to M4) are driven by the tail current $I_o$ of the same current value. To set equal operating input voltage ranges for the MOS differential pair (M5, M6) and for the quadritail cell (M1 to M4), the transistors M5 and M6 that make up the MOS differential pair (M5, M6) are unit transistors, whereas the transistors M1 to M4 that make up the quadritail cell are each of a size four times as large as the unit transistor.

The drains of the transistors M1 and M2 that form the quadritail cell (M1 to M4) are connected in common, so that two equal output currents (=$I_{SQ1}$) are delivered from the outputs of the current mirror circuit (M7; M8, M9), that is, from the drains of the transistors M8 and M9.

To exploit the differential output current of the MOS differential pair (M5, M6), a non-inverting output current (=2*$I_{D1}$) twice as large as the drain current $I_{D1}$ is output by the transistors M10 and M11 that make up a current mirror circuit, with the size of M11 being twice as large as that of M10. In similar manner, an inverting output current (=2*$I_{D2}$) twice as large as the drain current $I_{D2}$ is output by the transistors M12 and M13 that make up another current mirror circuit, with the size of M13 being twice as large as that of M12. These output currents are summed to the output currents $I_{SQ1}$ from the quadritail cell.

The p-ch MOS transistor M7, having a source connected to the power supply VDD and having a gate and a drain connected to the common drains of the n-ch MOS transistors M1 and M2, and the p-ch MOS transistors M8 and M9, having sources connected to the power supply VDD and having the gates connected in common and connected to the gate of the p-ch MOS transistor M7, make up a current mirror circuit. The p-ch MOS transistors M8 and M9 each have a size twice as large as that of the transistor M7. The drains of the transistors M8 and M9 are connected to the drains of the p-ch MOS transistors M11 and M13, respectively. The sum of the output currents of the transistors M8 and M9, that is, mirror currents of the output current $I_{SQ1}$ from the quadritail cell, and the output currents of the drains of the transistors M11 and M13, that is, the mirror currents twice as large as the output currents $I_{D1, 2}$ of the MOS differential pair, contains large quantities of d.c. current components. Hence, $0.984I_0$ is subtracted by the constant current sources from each of the respective sum currents ($I_{SQ1}+2*I_{D1, 2}$). The resulting currents are used as driving currents for driving the variable gain circuit made up by the first and second OTA circuits 11 and 12 (see FIG. 4).

In case the first and second OTA circuits 11 and 12 are bipolar transistors, the gain characteristic shown in FIG. 7 may be realized.

Or, if the first and second OTA circuits 11 and 12 are MOS transistors, the gain in dB in the gain characteristic shown in FIG. 7 is compressed to one half in terms of the dB value.

The SPICE simulation is carried out for confirmation. In this SPICE simulation, device parameters of the 0.35 μm process are used.

Figure 9:
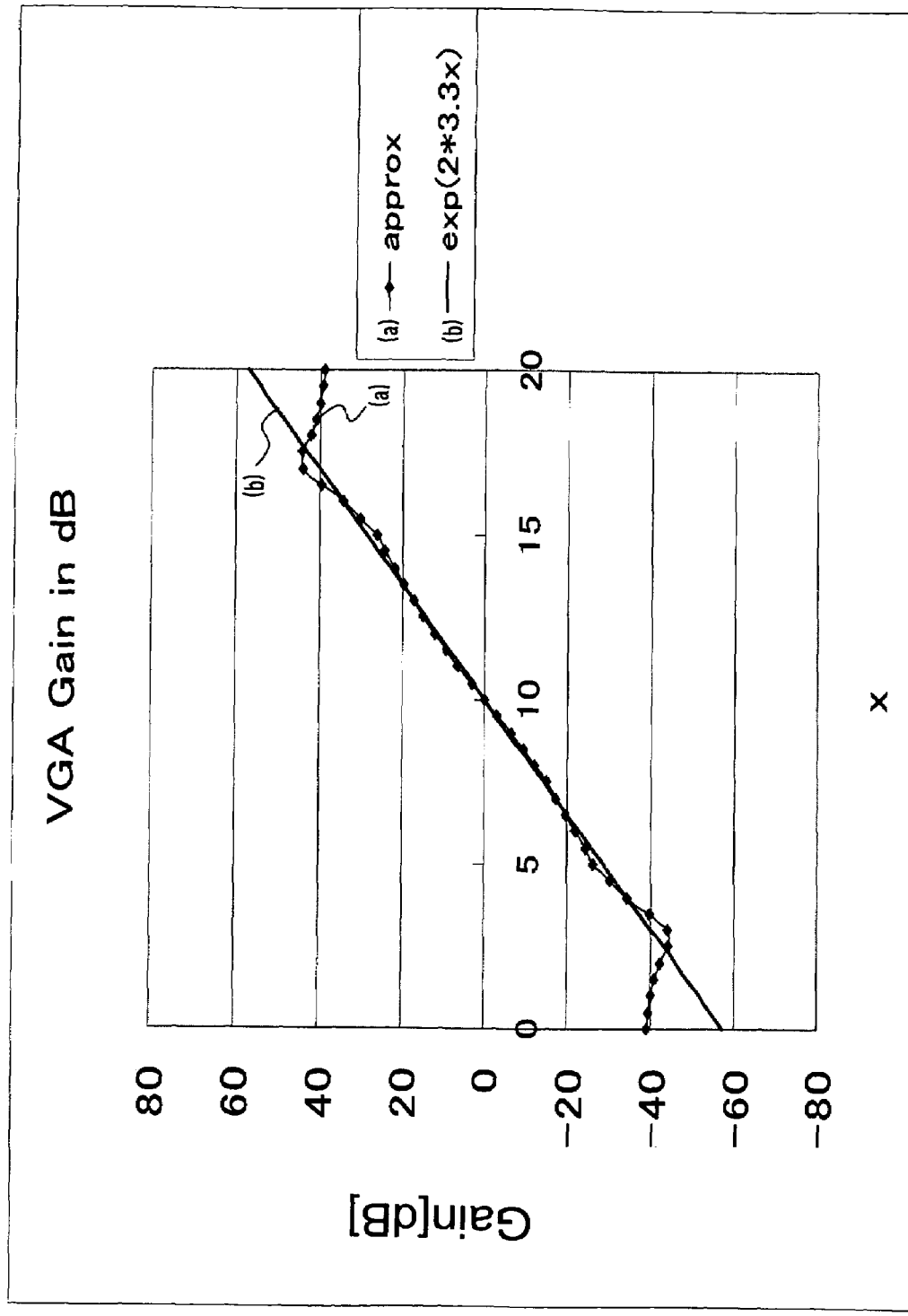
FIG. 9 is a graph showing representative gain characteristics of the circuit of FIG. 8.

In the circuit shown in FIG. 8, the transistors that make up the MOS differential pair and the quadritail cell are p-ch transistors. The values of the W/L ratio of the transistors M1 and M2 that make up the MOS differential pair are set to 10 μm/3 μm, those of the W/L ratio of the transistors M3 to M6 that make up the quadritail cell are set to 40 μm/3 μm, the respective tail currents $I_0$=100 μA, and the current of the subtracting current source (0.984110) is slightly changed and set to $0.974I_0$. FIG. 9 shows simulation values (VGA gain characteristic) of two control currents $I_{CON1}$ and $I_{CON2}$, that is, the currents driving the OTA1 and OTA2, respectively. In FIG. 9, (a) denotes an approximation and (b) denotes exp (2*3.3x).

The input signal is a differential voltage which is linearly changed during the time from 0 mS to 20 mS from −0.5V to 1.5V and from 1.5V to −0.5V.

Figure 10:
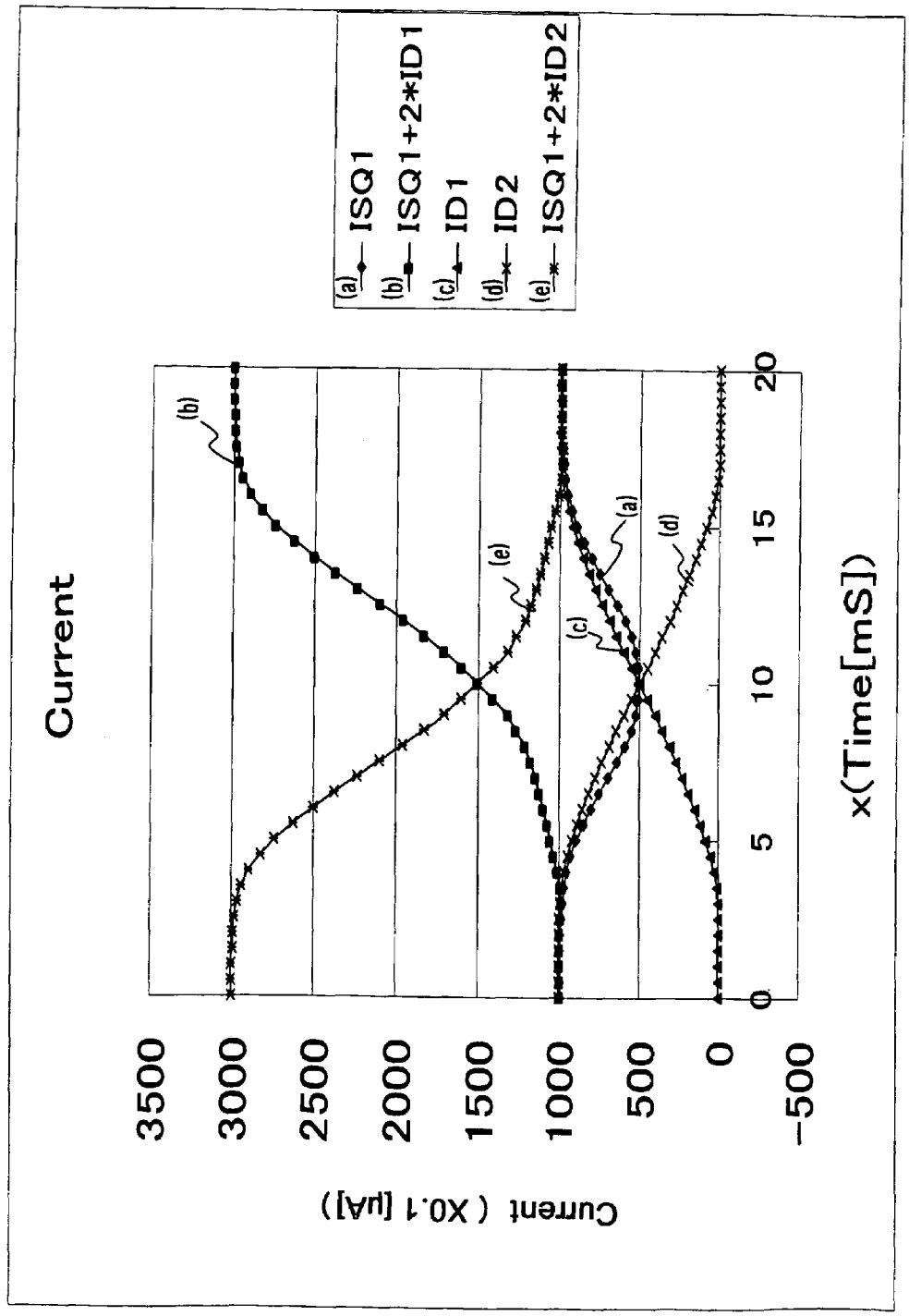
FIG. 10 is a graph showing the results of simulation of the respective currents of the circuit of FIG. 8.

The simulation values of the respective currents are shown in FIG. 10. In this figure, current waveforms (a) to (e) are for $I_{SQ1}$, $I_{SQ1}+2*I_{D1}$, $I_{D1}$, $I_{D2}$ and $I_{SQ2}+2*I_{D2}$, respectively.

The characteristic obtained includes an approximation error width of ±3.8 dB or less and a gain width of 86 dB (±343 dB) (see FIG. 9).

With the characteristic obtained, the approximation error is significantly larger than the calculated values shown in FIG. 9.

The reason is that, in the current characteristics of $I_{SQ1}+2*I_{D1}$ and $I_{SQ1}+2*I_{D2}$, in the simulated values of transfer characteristics of the quadritail cell and the MOS differential circuit, shown in FIG. 10, the current is linearly changed as it approaches the minimum value.

It is now checked whether this may or may not be improved.

Figure 11:
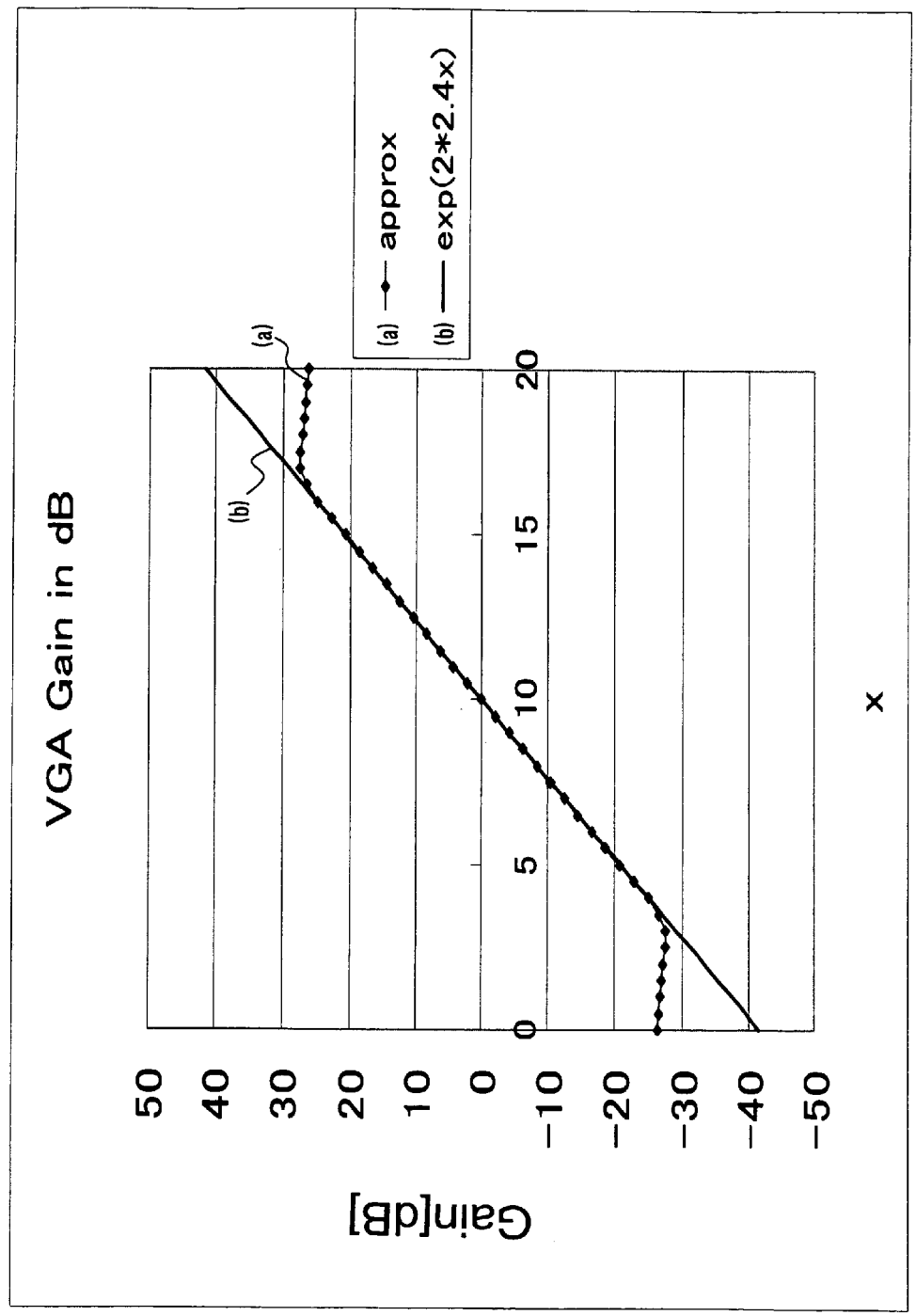
FIG. 11 is a graph showing representative gain characteristics of the circuit of FIG. 8.
Figure 12:
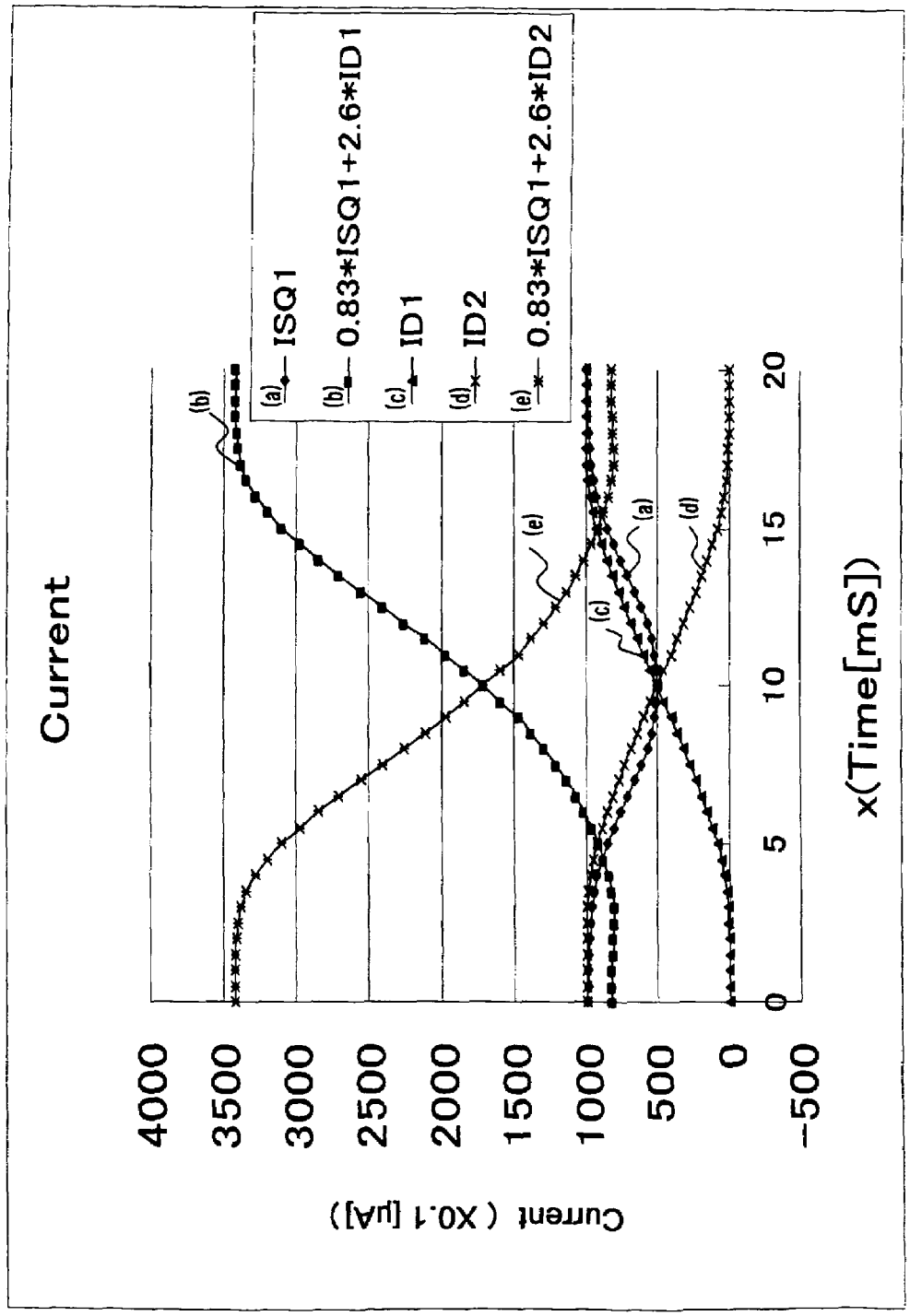
FIG. 12 is a graph showing the results of simulation of the respective currents of the circuit of FIG. 8.

FIG. 11 shows, for a control circuit employing the quadritail cell and the MOS differential circuit, shown in FIG. 8, the simulation values (VGA gain characteristic) of the two controlled currents $I_{CON1}$ and $I_{CON2}$ in case the values of the W/L ratio of the p-ch MOS transistors M1 and M2 are 10 μm/3 μm, the values of the W/L ratio of the p-ch MOS transistors M3 to M6 are 3 μm/3 μm, the respective tail currents $I_0$=100 μA, the current of the subtracting constant current source (0.984 $I_0$) is changed to 0.695 $I_0$, the ratio of current addition on the quadritail cell side is changed and set to 0.83 and that on the MOS differential circuit side is changed and set to 2.6. The simulated values of the respective currents are shown in FIG. 12. In this figure, the current waveforms of (a) to (e) are $I_{SQ1}$, $0.83I_{SQ1}+2.6*I_{D1}$, $I_{D1}$, $I_{D2}$ and $0.83*I_{SQ2}+2.6*I_{D2}$, respectively.

With the characteristic obtained, the range of the approximation error is ±0.2 dB, and the gain width of 46 dB (±23 dB) is secured.

Thus, with this sort of the variable gain circuit, there are cases where the approximation error may be reduced by changing the parameter and reducing the gain width.

Example 2

Figure 13:
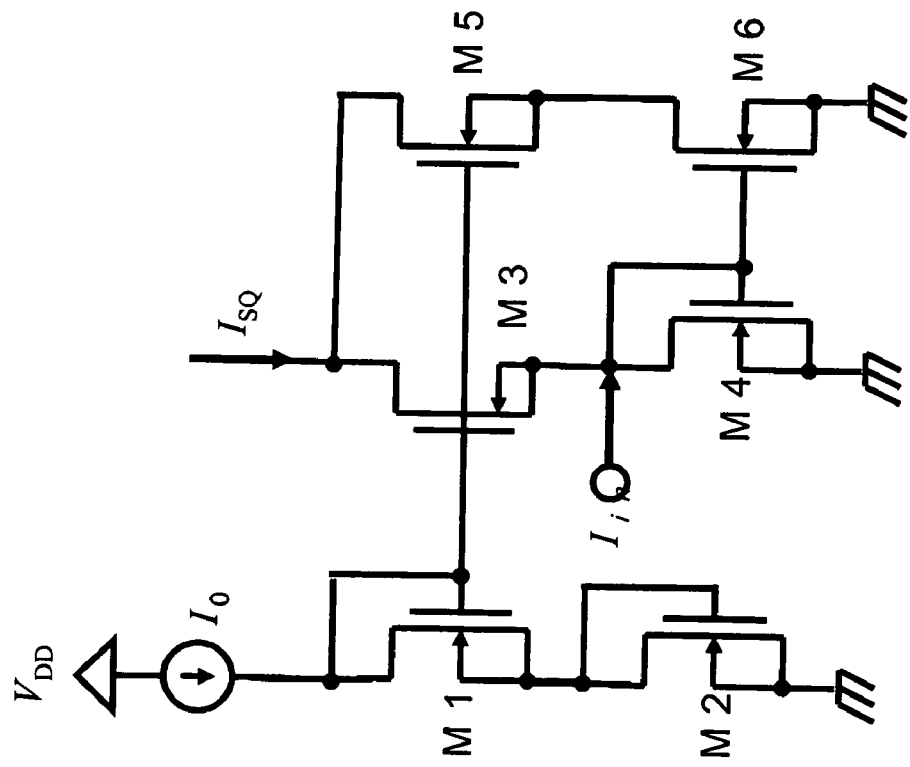
FIG. 13 is a diagram showing the circuit configuration of a current squaring circuit used in a second example of the present invention.

It may be envisaged to use a current squaring circuit as a control circuit. FIG. 13 shows an example of the current squaring circuit. Two diode-connected transistors M1 and M2 are connected in cascode and driven by a constant current source $I_0$ to constitute a bias circuit.

There are further provided two sets of cascode-connected transistors (M3, M4) and (M5, M6). The gates of the upper stage transistors (M3, M5) are connected together and connected to the gate of the upper stage transistor of the bias circuit.

The drains of the transistors (M3, M5) of the two sets of the cascode-connected transistors are connected in common to form an output terminal.

One of the lower stage transistors M4 of the two sets of the cascode-connected transistors (M3, M4) and (M5, M6) is diode-connected and forms an input terminal. The gate of the other lower stage transistor M6 is connected in common and connected to a junction of the gate and the drain of the transistor M4.

An output current $I_{SQ}$ is drawn in by an input current $I_{in}$.

In the current squaring circuit, shown in FIG. 13, the output current $I_{SQ}$ is $$I_{SQ} = 2I_0 + \frac{I_{in}^2}{8I_0}. \tag{21}$$

How the equation (21) is derived is now briefly described. With the respective gate-to-source voltages $V_{GS1}$ and $V_{GS2}$ of the MOS transistors M1 and M2 of the bias circuit, the respective gate-to-source voltages $V_{GS3}$ and $V_{GS4}$ of the MOS transistors M3 and M5 are related by $$V_{GS1}+V_{GS2}=V_{GS3}+V_{GS4} \tag{21-1}$$

The current flowing through the MOS transistors M1 and M2 is and is expressed by $$I_0=\beta/2(V_{GS1}-V_{TH})^2=\beta/2(V_{GS2}-V_{TH})^2 \tag{21-2}$$

The currents flowing through the MOS transistors M3 and M4 are $I_3$ and $I_4$, respectively, and are given by $$I_3=\beta/2(V_{GS3}-V_{TH})^2 \tag{21-3}$$

and $$I_4 = \beta/2(V_{GS4} - V_{TH})^2 \tag{21-4}$$

Hence, $$V_{GS1} = V_{GS2} = V_{TH} + \sqrt{(2I_0/\beta)} \tag{21-5}$$

$$V_{GS3} = V_{TH} + \sqrt{(2I_3/\beta)} \tag{21-6}$$

$$V_{GS4} = V_{TH} + \sqrt{(2I_4/\beta)} \tag{21-7}$$

Substituting the equations (21-5) to (21-7) into the equation (21-1), $$2\sqrt{(2I_0/\beta)} = \sqrt{(2I_3/\beta)} + \sqrt{(2I_4/\beta)} \tag{21-8}$$

If the current flowing through the MOS transistor M5 is $I_5$, we have the following equation.

$$I_{SQ} = I_3 + I_5 \tag{21-9}$$

If the current flowing through the MOS transistor M4 is $I_4$, we have the following equation.

$$I_4 = I_3 + I_{in} \tag{21-10}$$

Since the current $I_6$ of the transistor M6, constituting the current mirror with the transistor M4, is given by $I_6 = I_4 = I_5$, $$I_3 + I_{in} = I_5 \tag{21-11}$$

Thus, from the equations (21-9) and (21-11), we have $$I_3 = (I_{SQ} - I_{in})/2 \tag{21-12}$$

$$I_4 = (I_{SQ} + I_{in})/2 \tag{21-13}$$

Substituting (21-12) and (21-13) into (21-8), and eliminating $\sqrt{\beta}$ of the denominator, we have $$2\sqrt{(2I_0)} = \sqrt{I_{SQ} - I_{in}} + \sqrt{I_{SQ} + I_{in}} \tag{21-14}$$

Squaring both sides of (21-14) yields $8I_0 = 2I_{SQ} + 2\sqrt{(I_{SQ}^2 - I_{in}^2)}$.

From $4I_0 - I_{SQ} = \sqrt{(I_{SQ}^2 - I_{in}^2)}$, further squaring both sides yields $I_{SQ} = I_{in}^2/(8I_0) + 2I_0$.

The differential currents $I_{D1}$ and $I_{D2}$ of the MOS differential pair, shown by the equation (16), are labeled $I_{in1}$ and $I_{in2}$. These currents $I_{in1}$ and $I_{in2}$ are each squared by two current squaring circuits (two sets of the cascoded transistors). It should be noticed that the MOS differential pair is made up of M1 and M2 of FIG. 16, and are supplied with a differential control voltage $V_C$.

$$\frac{I_{SQ1}}{I_{SQ2}} = \frac{2I_0 + \frac{I_{in1}^2}{8I_0}}{2I_0 + \frac{I_{in2}^2}{8I_0}} = \frac{2I_0 + \frac{I_{D1}^2}{8I_0}}{2I_0 + \frac{I_{D2}^2}{8I_0}} = \frac{16 + \left(\frac{I_{D1}}{I_0}\right)^2}{16 + \left(\frac{I_{D2}}{I_0}\right)^2}. \tag{22}$$

Subtracting the constant current from the equation (17) yields the function of form represented by an equation (23):

$$G = \{(I_{D1}/I_0)^2 + k\}/\{(I_{D2}/I_0)^2 + k\} \tag{23}$$

The differential currents $I_{D1}$ and $I_{D2}$ of the MOS differential pair have a transfer function close to $\frac{1}{2} \pm x/2$, as indicated by the equation (16). Hence, $k \approx K/4$.

In actuality, substituting the equation (16) into the equation (23) yields $$G = \frac{k + \frac{1}{4} + \frac{x^2}{2} - \frac{x^4}{4} + \frac{x}{\sqrt{2}}\sqrt{1 - \frac{x^2}{2}}}{k + \frac{1}{4} + \frac{x^2}{2} - \frac{x^4}{4} - \frac{x}{\sqrt{2}}\sqrt{1 - \frac{x^2}{2}}} \tag{24}$$

With approximation by $$\sqrt{1 - \frac{x^2}{2}} \approx 1 - \left(1 - \frac{1}{\sqrt{2}}x^2\right) \quad (|x| \leq 1) \tag{25}$$

the equation (24) is represented by $$G \approx \frac{k + \frac{1}{4} + \frac{x}{\sqrt{2}} + \frac{x^2}{2} - \left(\frac{1}{\sqrt{2}} - \frac{1}{2}\right)x^3 - \frac{x^4}{4}}{k + \frac{1}{4} - \frac{x}{\sqrt{2}} + \frac{x^2}{2} + \left(\frac{1}{\sqrt{2}} - \frac{1}{2}\right)x^3 - \frac{x^4}{4}} \tag{26}$$

which includes the terms up to a term of the fourth order of the variable x.

With k as a parameter, an approximation error of the approximation (23) is scrutinized.

Figure 14:
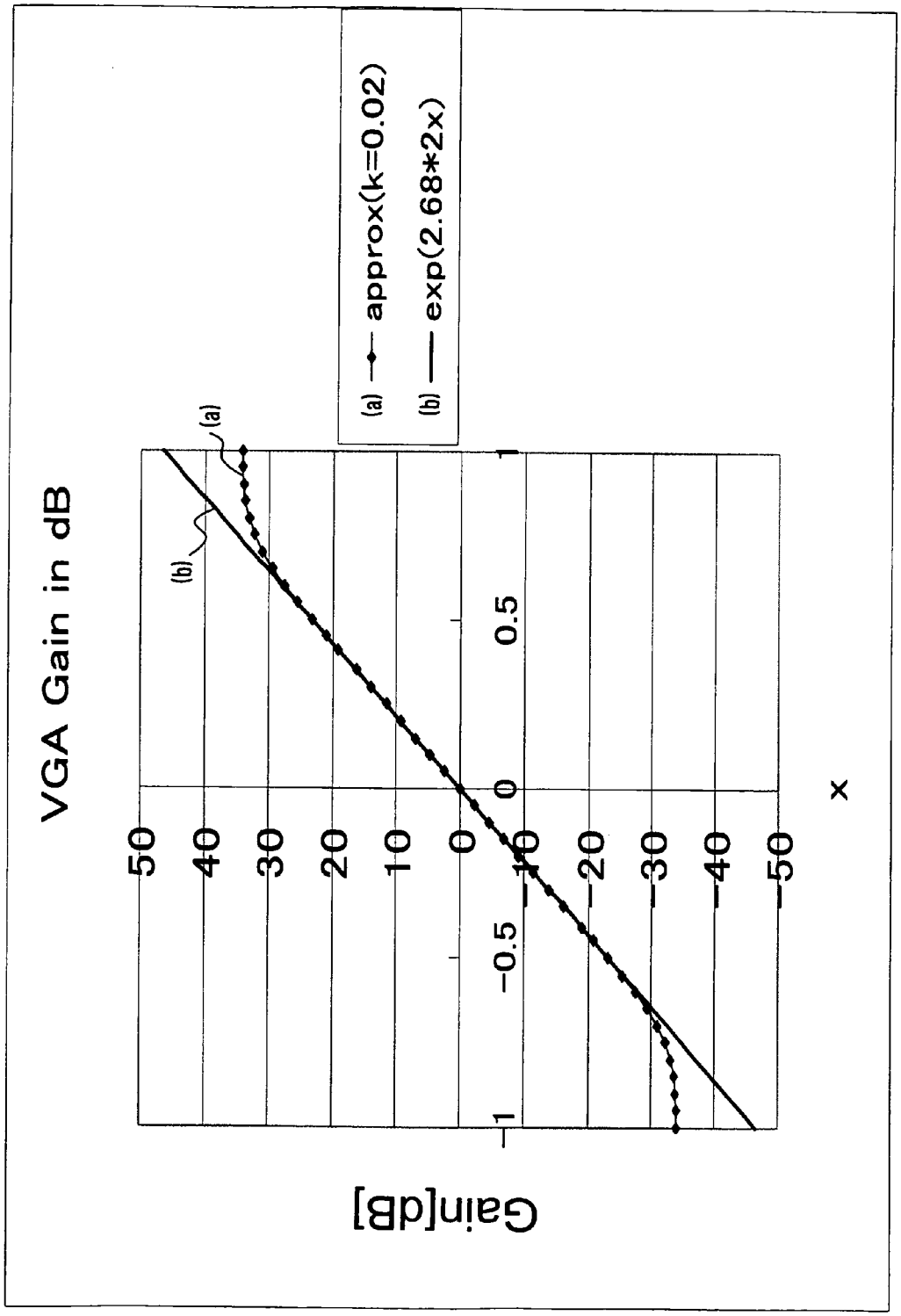
FIG. 14 is a graph showing a first exponential characteristic derived from the current squaring circuit used in the second example of the present invention.

FIG. 14 shows a case where k=0.02 is set using a constant current source. For the width of change of ±30 dB, the approximation error is within a range of ±0.15 dB.

Figure 15:
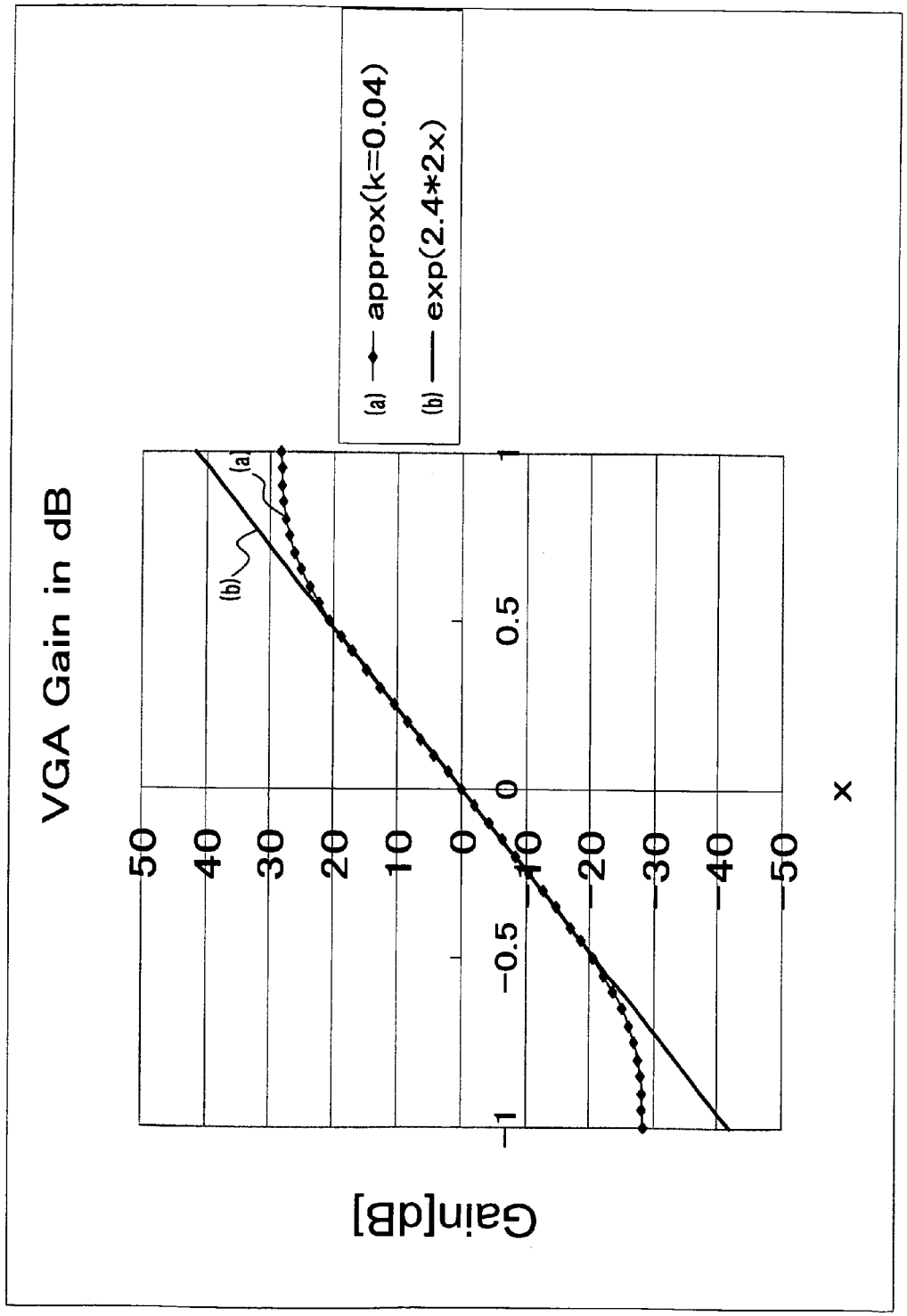
FIG. 15 is a graph showing a second exponential characteristic derived from the current squaring circuit used in the second example of the present invention.

FIG. 15 shows a case where k=0.04 is set using a constant current source. For the width of change of ±20 dB, the approximation error is within a range of ±0.32 dB.

Figure 16:
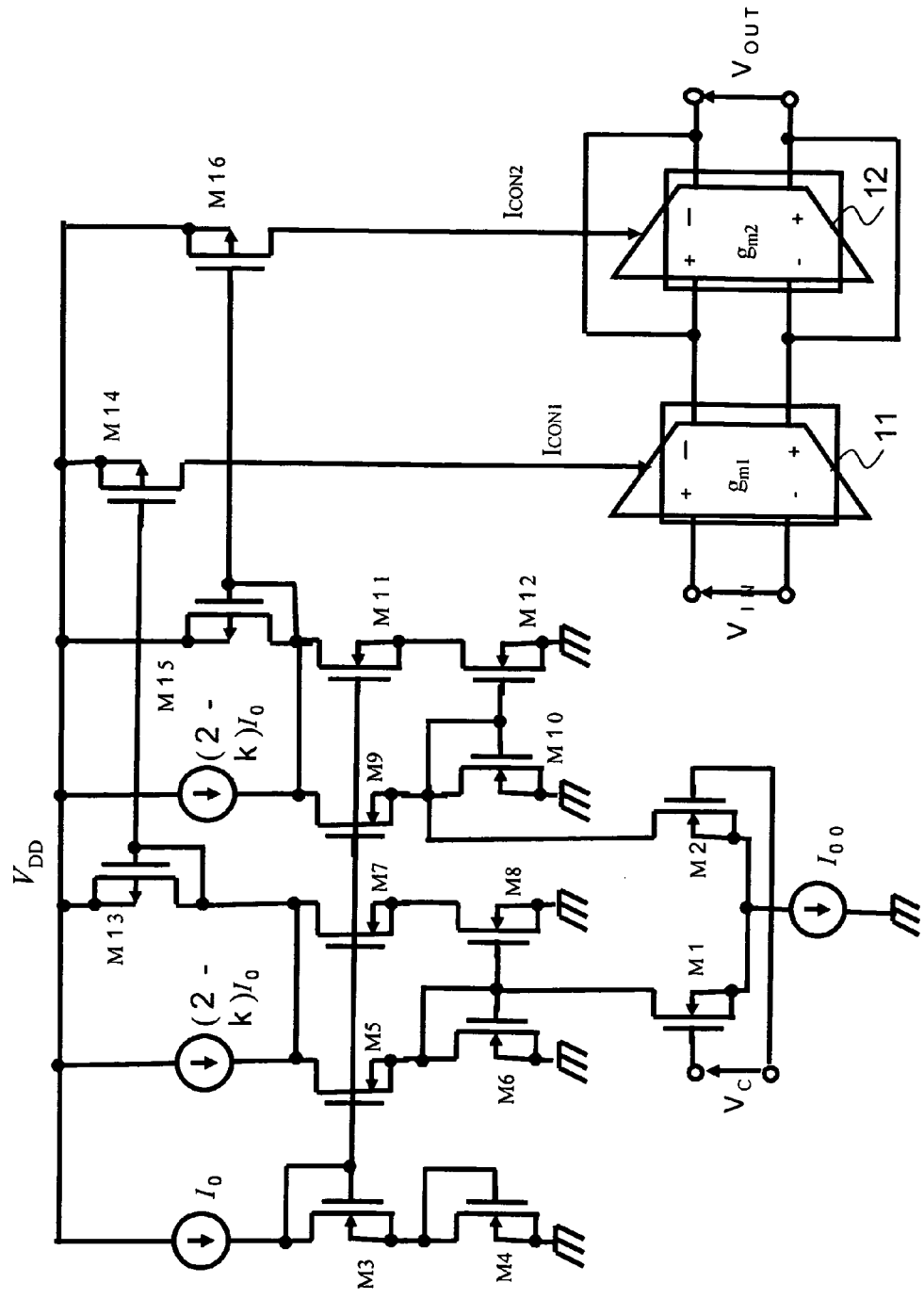
FIG. 16 is a diagram showing a circuit configuration of the second example of the present invention.

FIG. 16 shows an implementing circuit. Referring to FIG. 16, the control signal $V_C$ is applied across the gate terminals of the transistors M1 and M2 constituting the MOS differential pair.

The current squaring circuit includes a common bias circuit (M3, M4) and two sets of current squaring circuit sections (M5 to M8) and (M9 to M12). A non-inverting output current and an inverting output current of the MOS differential pair (M1, M2) are drawn in from the input terminal of the current squaring circuit sections. The bias circuit (M3, M4) of FIG. 16 corresponds to the bias circuit (M1, M2) of FIG. 13, whilst the current squaring circuit sections (M5 to M8) and (M9 to M12) of FIG. 16 correspond to the current squaring circuit section (M3 to M6) of FIG. 13.

The MOS differential pair (M1, M2) and the current squaring circuits are driven by the same current ($I_0$). The current from the constant current source of a current value of (2−k)$I_0$ is supplied to the outputs of the two sets of the current squaring circuit sections to subtract the current from the output current. The resulting current is transmitted via transistors M13 and M14 that make up a current mirror circuit and via transistors M15 and M16 that make up another current mirror circuit so as to be used as a driving current for driving the variable gain circuit made up by the first and second OTA circuits 11 and 12 (FIG. 4).

Thus, if the first and second OTA circuits 11 and 12 are bipolar circuits, the gain characteristics shown in FIGS. 14 and 15 are realized.

If the first and second OTA circuits 11 and 12 are MOS circuits, the gain characteristics in which the gain represented in dB in FIGS. 14 and 15 are halved in terms of the dB value may be realized.

The SPICE simulation is carried out for confirmation. In this SPICE simulation, device parameters of the 0.35 μm process are used.

Figure 17:
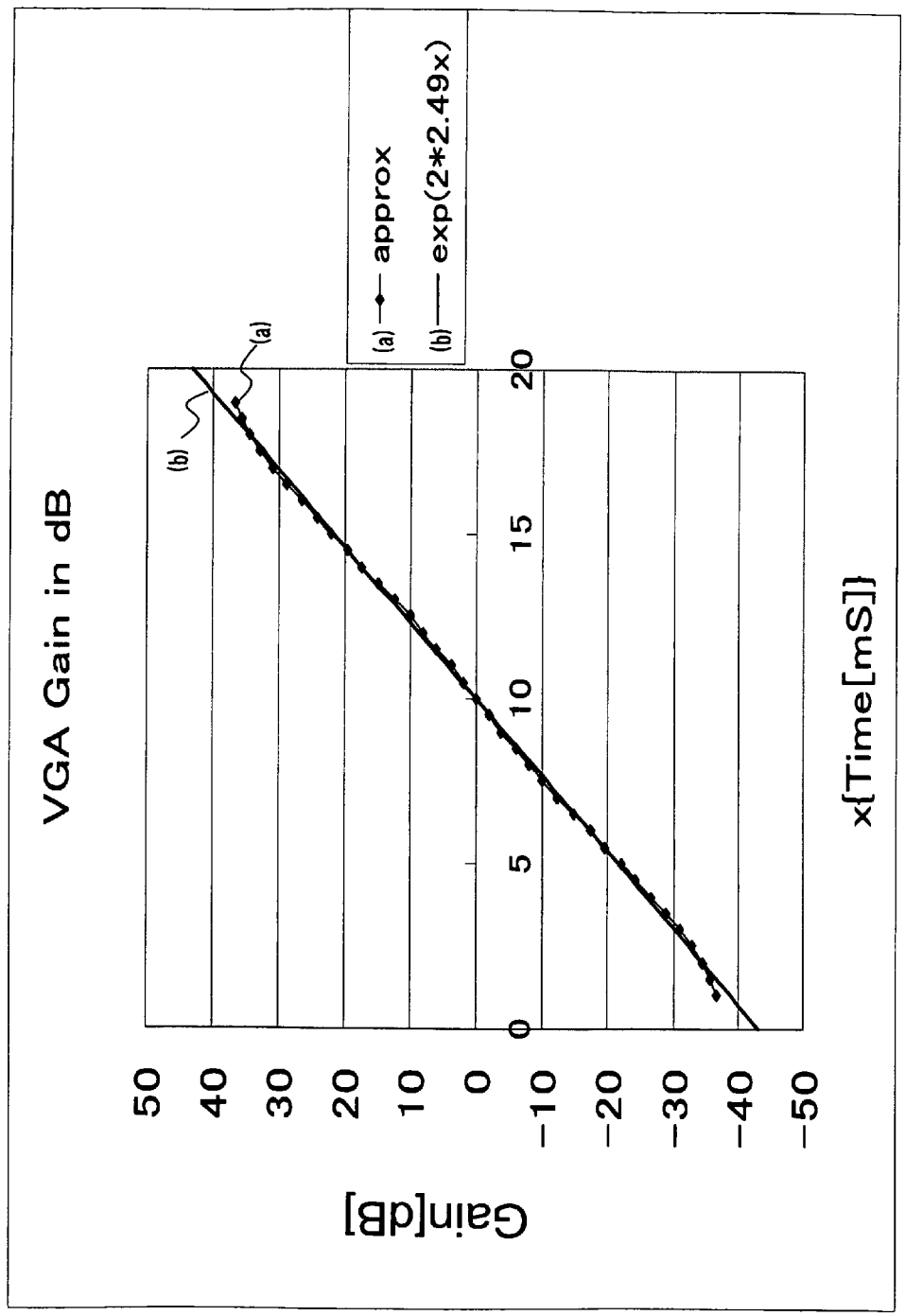
FIG. 17 is a graph showing a gain characteristic of the second example of the present invention.

FIG. 17 shows, for a control circuit made up of the squaring circuit and the MOS differential circuit, shown in FIG. 16, the simulation values (VGA gain characteristic) of two controlled currents $I_{CON1}$ and $I_{CON2}$ in case the values of the W/L ratio of the p-ch MOS transistors M1 and M2 are 10 μm/3 μm, the values of the W/L ratio of the p-ch MOS transistors M3 to M12 are 40 μm/3 μm, $I_{00}$=100 μA, $I_0$=50 μA and $(2-k)I_0$ is set to $1.9818I_0$.

The input signal is a differential voltage and, for time changes from 0 mS to 20 mS, is linearly changed from 1V to 3V and from 3V to 1V (2V±1). As for the characteristics obtained, the range of the approximation error is ±0.77 dB or less, while the gain width of 70 dB (±35 dB) is secured.

Figure 18:
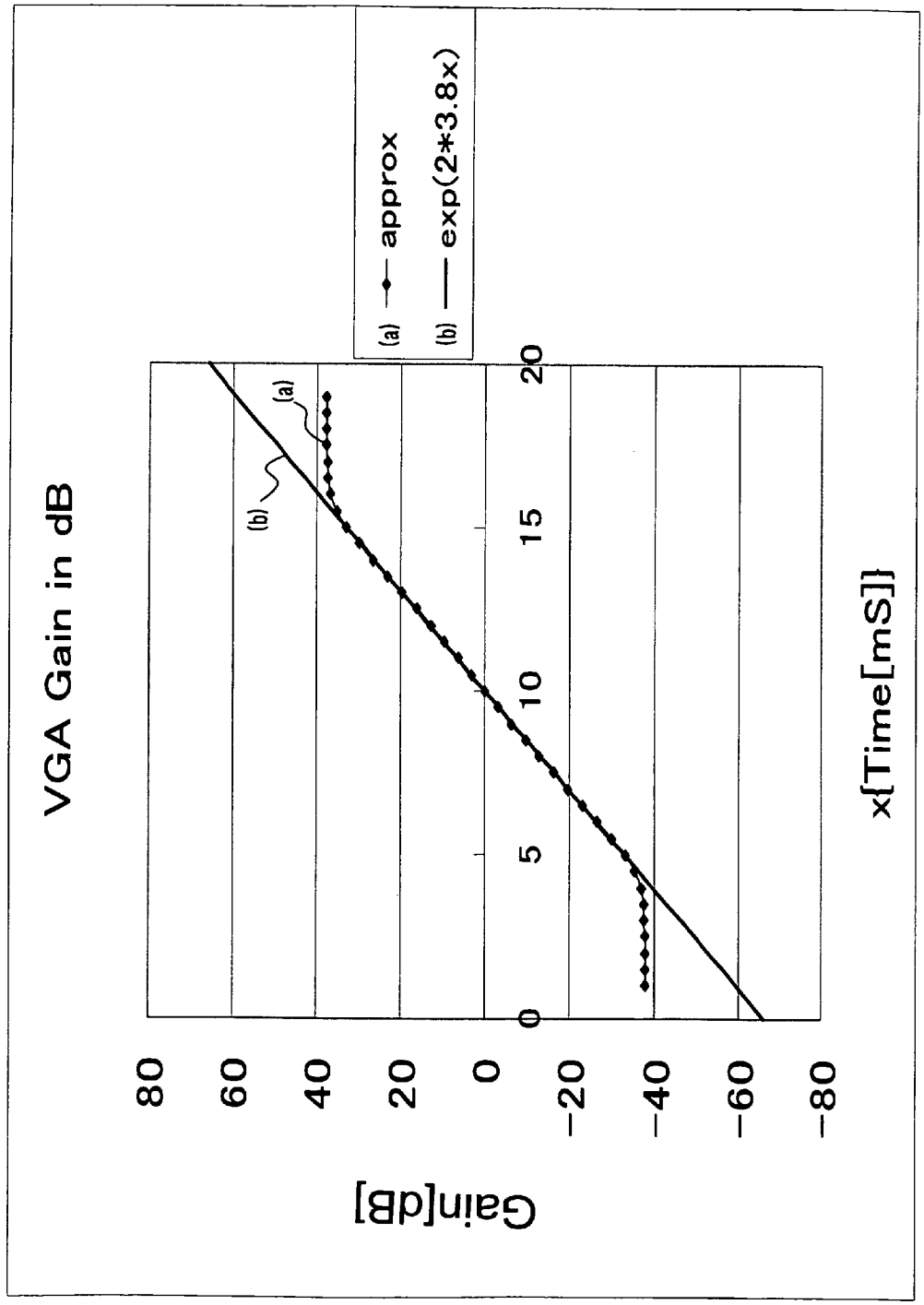
FIG. 18 is a graph showing another gain characteristic of the second example of the present invention.

FIG. 18 shows, for a control circuit made up of the squaring circuit and the MOS differential circuit, shown in FIG. 16, the simulation values (VGA gain characteristic) of the two controlled currents $I_{CON1}$ and $I_{CON2}$ in case the value of the W/L ratio of each of the p-ch MOS transistors M1 and M2 is 10 μm/3 μm, the value of the W/L ratio of each of the p-ch MOS transistors M3 to M12 is 40 μm/3 μm, $I_{00}$=100 μA, $I_0$=25 μA and $(2-k)I_0$ is set to $1.9754I_0$.

As for the characteristic obtained, the range of the approximation error is ±0.3 dB or less, and the gain width of 66 dB (±33 dB) is secured. In this case, the approximation error may be decreased by changing the parameter and reducing the gain width.

As an instance for practical use of the present invention, it may be envisaged to apply the invention to a high-gain variable gain circuit in an RF chip of a wireless mobile terminal, for instance.

The disclosures of the aforementioned Patent Document and the Non-Patent Document are incorporated herein by reference. Within the framework of the entire disclosure of the present invention, inclusive of claims, the examples or examples may be changed or adapted, based on the basic technical concept of the invention. That is, those skilled in the art can change or modify the examples or examples without departing from the scope and the spirit of the invention.

What is claimed is:

1. A variable gain circuit comprising a region in which a gain thereof is changed substantially exponentially as a function of a control voltage, said circuit comprising a region in which the gain is changed substantially exponentially based on a function $$\{(1+x)^2+K\}/\{(1-x)^2+K\}$$

where x is a variable indicating said control voltage, and K is a parameter less than or equal to 1.

2. The variable gain circuit according to claim 1, wherein the parameter K in said function is 0.21.

3. The variable gain circuit according to claim 1, wherein a denominator and a numerator of said function are proportionate to driving currents of first and second OTAs (operational transconductance amplifiers), respectively.

4. The variable gain circuit according to claim 1, comprising: a MOS (metal-oxide-semiconductor) differential pair; and a quadritail cell including first to fourth transistors, driven by a common tail current, wherein outputs of the first and second transistors receiving a differential input voltage, as said control voltage, being are connected in common, wherein outputs of the third and fourth transistors, receiving a common mode voltage of said differential input voltage, being are connected in common, and wherein a denominator and a numerator of said function for the gain are constituted by an output current of said MOS differential pair and an output current of said quadritail cell, respectively.

5. The variable gain circuit according to claim 1, comprising:

first and second MOS current squaring circuits, each of said first and second MOS current squaring circuits comprising:

two sets of cascode-connected transistors, the gates of the transistors of an upper stage of each set of the cascode-connected transistors being connected in common, the drain and the gate of one of the lower stage transistors being connected in common to form a current input terminal, output currents of said two sets of the cascode-connected transistors being summed to generate a squared current, wherein a denominator and a numerator of said function of said gain is formed by subtracting the constant current from the output currents of said first and second current squaring circuits, respectively.

6. The variable gain circuit according to claim 1, comprising:

a first OTA circuit (operational transconductance amplifier circuit) that receives a differential input voltage to output a differential current; and a second OTA circuit that receives the differential output current from said first OTA circuit, said second OTA circuit including input and output terminals connected together to perform current-to-voltage conversion, wherein said function for the gain Gv is given by Gv=gm1/gm2, where gm1 is a mutual conductance of said first OTA circuit and gm2 is a mutual conductance of said second OTA circuit, and wherein the mutual conductance gm1 of said first OTA circuit and the mutual conductance gm2 of said second OTA circuit, respectively forming a numerator and a denominator of said function, are proportionate to driving currents of said first and second OTA circuits, respectively.

7. The variable gain circuit according to claim 1, comprising:

a first OTA circuit (operational transconductance amplifier circuit) that receives a differential input voltage to output a differential output current; and a second OTA circuit that receives a differential output current from said first OTA circuit, said second OTA circuit including input and output terminals connected together to perform current-to-voltage conversion, wherein said function for the gain Gv is given by Gv=gm1/gm2, where gm1 is a mutual conductance of said first OTA circuit and gm2 is a mutual conductance of said second OTA circuit, and wherein the mutual conductance gm1 of said first OTA circuit and the mutual conductance gm2 of said second OTA circuit, respectively forming a numerator and a denominator of said function, are proportionate to square roots of the driving currents for said first and second OTA circuits, respectively.

8. The variable gain circuit according to claim 6, further comprising:

a quadritail cell comprising:

first and second transistors including gates differentially supplied with said control voltage and including drains connected in common; and third and fourth transistors including gates supplied with a voltage divided from said control voltage and including drains connected in common, the sources of said first to fourth transistors being connected in common and connected to a first current source;

a differential pair including gates differentially supplied with said control voltage, said differential pair including sources connected in common and connected to a second current source;

a first current mirror circuit receiving an output current of said quadritail cell and outputting a first current; and second and third current mirror circuits respectively receiving a differential output current of said differential pair, said second and third current mirror circuits outputting second and third currents, respectively, wherein said first OTA circuit is driven based on a sum current of said first current from said first current mirror circuit and the second current from said second current mirror circuit, and wherein said second OTA circuit is driven based on a sum current of said first current from said first current mirror circuit and the third current from said third current mirror circuit.

9. The variable gain circuit according to claim 8, wherein there is supplied, to said first OTA circuit, as a driving current, a current corresponding to a sum current of said first current from said first current mirror circuit and said second current from said second current mirror circuit, less a preset current, and wherein there is supplied, to said second OTA circuit, as a driving current, a current corresponding to a sum current of said first current from said first current mirror circuit and said third current from said third current mirror circuit, less a preset current.

10. The variable gain circuit according to claim 8, wherein the size of said first to fourth transistors of said quadritail cell is four times that of a unit transistor, and wherein the size of output transistors of said second and third current mirror circuits is twice that of said unit transistor.

11. The variable gain circuit according to claim 6, further comprising:

a differential pair including gates differentially supplied with said control voltage, said differential pair including coupled sources connected to a first current source;

a bias circuit including two diode-connected transistors connected in cascode, said bias circuit being driven by a second constant current source;

first and second current squaring circuits, biased by said bias circuit in common, said first and second current squaring circuits respectively receiving differential output currents from said differential pair at input terminals thereof; and first and second current mirror circuits receiving currents from output terminals of said first and second current squaring circuits, respectively, and outputting first and second currents, respectively, each of said first and second current squaring circuits including two sets of cascoded transistors, wherein:

gates of upper stage transistors of said two sets of cascoded transistors are connected in common and connected to a gate of upper stage transistor of the cascoded transistors of said bias circuit, drains of said upper stage transistors of said two sets of cascoded transistors are connected in common to form the output terminal of said current squaring circuit, one lower stage transistor of said two sets of cascoded transistors is diode-connected with a drain thereof forming the input terminal of said current squaring circuit, gates of the other lower stage transistor of said two sets of the cascoded transistors is connected to connection node of the gate and the drain of said one lower stage transistor, said first OTA circuit is supplied with the first current from said first current mirror circuit as a driving current, and said second OTA circuit is supplied with the second current from said second current mirror circuit as a driving current.

12. The variable gain circuit according to claim 11, further comprising third and fourth current sources connected to said output terminals of said first and second current squaring circuits.

13. A variable gain apparatus comprising:

a gain module providing gain to an input signal; and a control module controlling a gain module for variable gain, wherein the gain module and control module provide gain that is changed substantially exponentially based on a function $$\{(1+x)^2+K\}/\{(1-x)^2+K\}$$

where x is a variable indicating a control voltage, and K is a parameter less than or equal to 1.

14. The variable gain apparatus according to claim 13, wherein the gain module comprises:

a first OTA circuit (operational transconductance amplifier circuit) that receives a differential input voltage to output a differential current; and a second OTA circuit that receives the differential output current from said first OTA circuit, said second OTA circuit including input and output terminals connected together to perform current-to-voltage conversion, wherein a denominator and a numerator of said function are proportionate to driving currents of first and second OTAs (operational transconductance amplifiers), respectively.

15. The variable gain apparatus according to claim 13, wherein the control module comprises:

a quadritail cell comprising:

a first unit differentially supplied with said control voltage; and a second unit controlled with a voltage divided from said control voltage and receive a first current source, a third unit differentially controlling said control voltage from the quadritail cell, said third unit being connected to a second current source;

a current mirror unit receiving an output current of said quadritail cell, and outputting a first current; and a second current mirror unit receiving a differential output current of said third unit and outputting a second current and a third current, wherein a denominator and a numerator of said function for the gain are constituted by an output current of said third unit and an output current of said quadritail cell, respectively.

16. The variable gain apparatus according to claim 13, wherein the control module comprises:

a differential pair including gates differentially supplied with said control voltage, said differential pair including coupled sources connected to a first current source;

a bias circuit including two diode-connected transistors connected in cascode, said bias circuit being driven by a second constant current source;

first and second current squaring circuits, biased by said bias circuit in common, said first and second current squaring circuits respectively receiving differential output currents from said differential pair at input terminals thereof; and first and second current mirror circuits receiving currents from output terminals of said first and second current squaring circuits, respectively, and outputting first and second currents, respectively, each of said first and second current squaring circuits including two sets of cascoded transistors, wherein a denominator and a numerator of said function of said gain is formed by subtracting constant current from the output currents of said first and second current squaring circuits, respectively.

17. The variable gain apparatus according to claim 13, wherein a denominator and a numerator of said function for the gain are based on a first output current and a second current, respectively, from the control module.

18. The variable gain apparatus according to claim 13, wherein a denominator and a numerator of said function are proportionate to a first driving current and a second driving current of the gain module, respectively.

19. A variable gain circuit comprising:

an input circuit receiving an input signal; and a first circuit region receiving the input signal from the input circuit and providing a variable gain of the input signal, wherein the first circuit region provides gain that is changed substantially exponentially based on a function $$\{(1+x)^2+K\}/\{(1-x)^2+K\}$$

where x is a variable indicating the control voltage, and K is a parameter less than or equal to 1.

20. The variable gain circuit according to claim 19, wherein the first circuit region comprises:

a first stage amplifying the input signal; and a second stage providing a control for said first stage, wherein a denominator and a numerator of said function for the gain are based on a first output current and a second current, respectively, from the second stage, and wherein the denominator and the numerator of said function are proportionate to a first driving current and a second driving current of the first stage, respectively.

* * * * *